United States Patent
Kim et al.

(10) Patent No.: US 9,564,352 B2
(45) Date of Patent: Feb. 7, 2017

(54) METHOD FOR FABRICATING SEMICONDUCTOR DEVICE INCLUDING ISOLATION LAYER

(71) Applicant: SK hynix Inc., Gyeonggi-do (KR)

(72) Inventors: Jae-Soo Kim, Gyeonggi-do (KR); Hyung-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/626,567

(22) Filed: Feb. 19, 2015

(65) Prior Publication Data

US 2015/0162237 A1 Jun. 11, 2015

Related U.S. Application Data

(63) Continuation of application No. 13/828,724, filed on Mar. 14, 2013, now Pat. No. 8,994,144.

(30) Foreign Application Priority Data

Dec. 11, 2012 (KR) ........................ 10-2012-0143247

(51) Int. Cl.
| | |
|---|---|
| H01L 27/04 | (2006.01) |
| H01L 21/762 | (2006.01) |
| H01L 27/108 | (2006.01) |
| H01L 21/76 | (2006.01) |
| H01L 27/12 | (2006.01) |
| H01L 29/06 | (2006.01) |
| H01L 21/02 | (2006.01) |

(52) U.S. Cl.
CPC ..... *H01L 21/76224* (2013.01); *H01L 21/0223* (2013.01); *H01L 21/02271* (2013.01); *H01L 21/02282* (2013.01); *H01L 21/76229* (2013.01); *H01L 27/10844* (2013.01); *H01L 27/10894* (2013.01); *H01L 29/0649* (2013.01); *H01L 27/10876* (2013.01)

(58) Field of Classification Search
CPC .......... H01L 21/76224; H01L 21/0223; H01L 21/02271; H01L 27/10844; H01L 21/02282; H01L 21/76229; H01L 27/10894; H01L 29/0649; H01L 27/10876
USPC ................................. 257/508–518
See application file for complete search history.

(56) References Cited

U.S. PATENT DOCUMENTS

| | | | | |
|---|---|---|---|---|
| 4,855,804 A | * | 8/1989 | Bergami | H01L 21/76229 257/513 |
| 2008/0087981 A1 | * | 4/2008 | Matsuno | H01L 21/76232 257/510 |
| 2013/0093040 A1 | * | 4/2013 | Kim | H01L 21/84 257/506 |
| 2013/0249048 A1 | * | 9/2013 | Kim | H01L 27/10894 257/506 |

* cited by examiner

*Primary Examiner* — Marc Armand
*Assistant Examiner* — Nelson Garces
(74) *Attorney, Agent, or Firm* — IP & T Group LLP

(57) ABSTRACT

A semiconductor device includes a first isolation layer formed in a trench in a substrate. The isolation layer includes a first oxide layer formed in the trench and a second oxide layer formed over the first oxide layer, wherein the first oxide layer and the second oxide layer have a same composition.

10 Claims, 17 Drawing Sheets

FIRST REGION | SECOND REGION

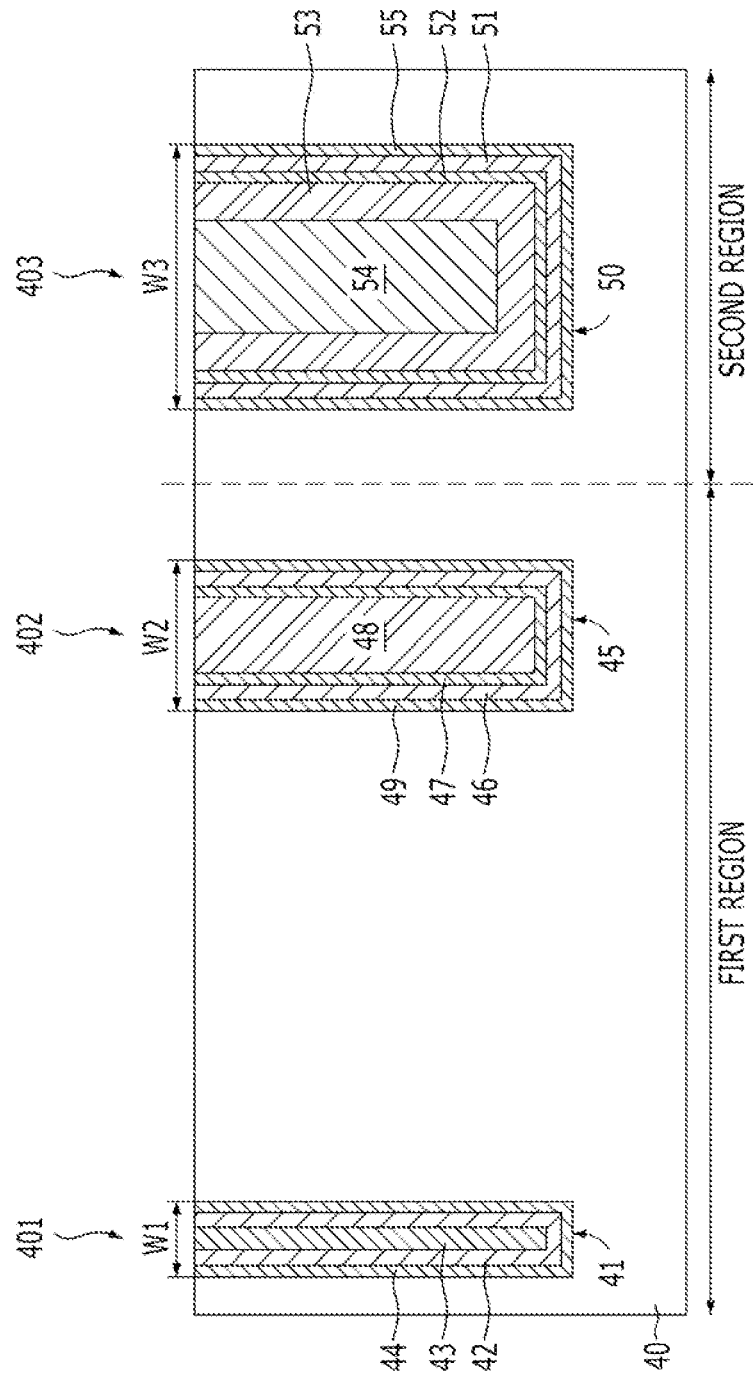

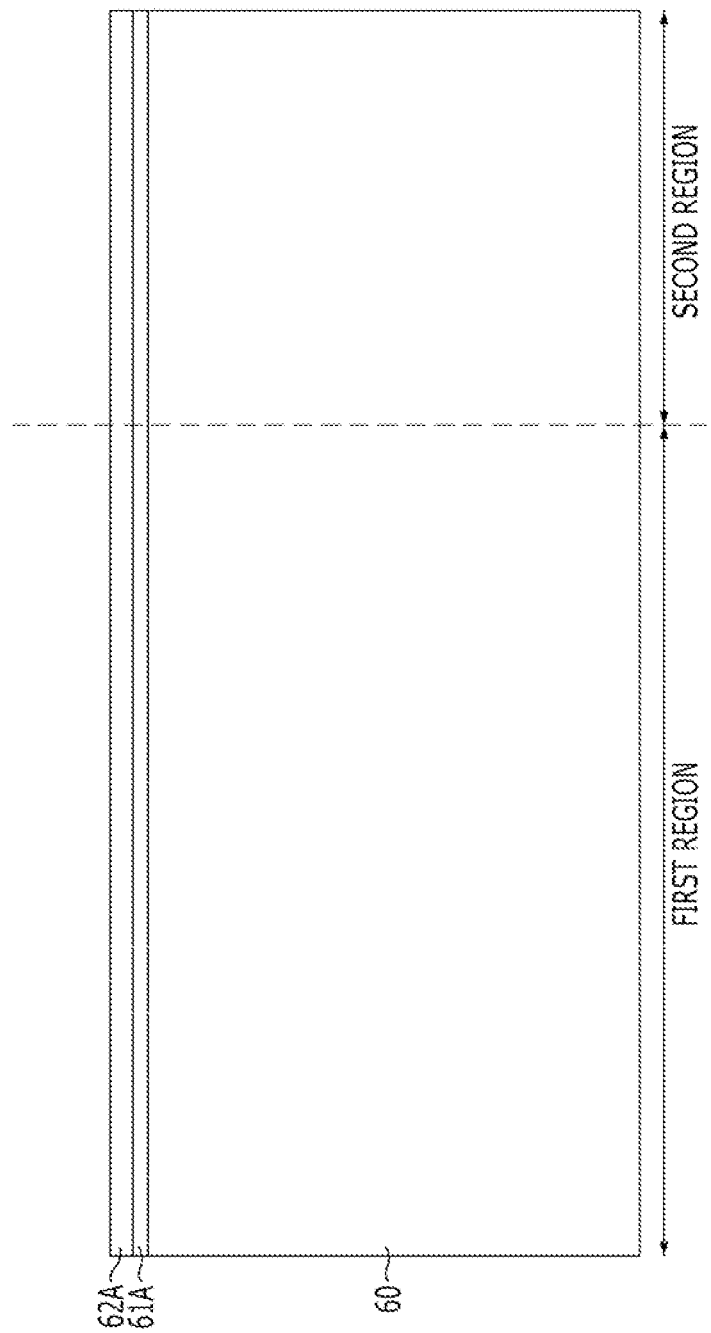

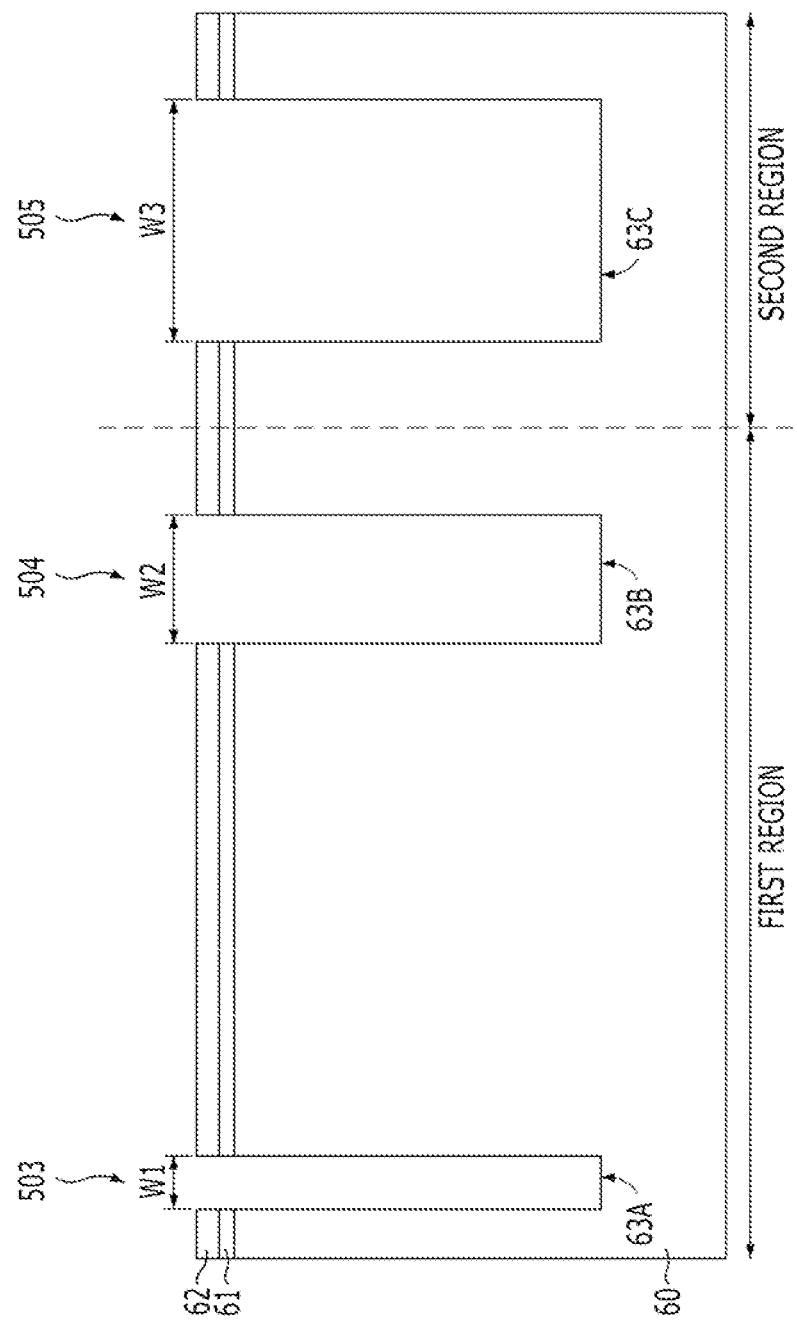

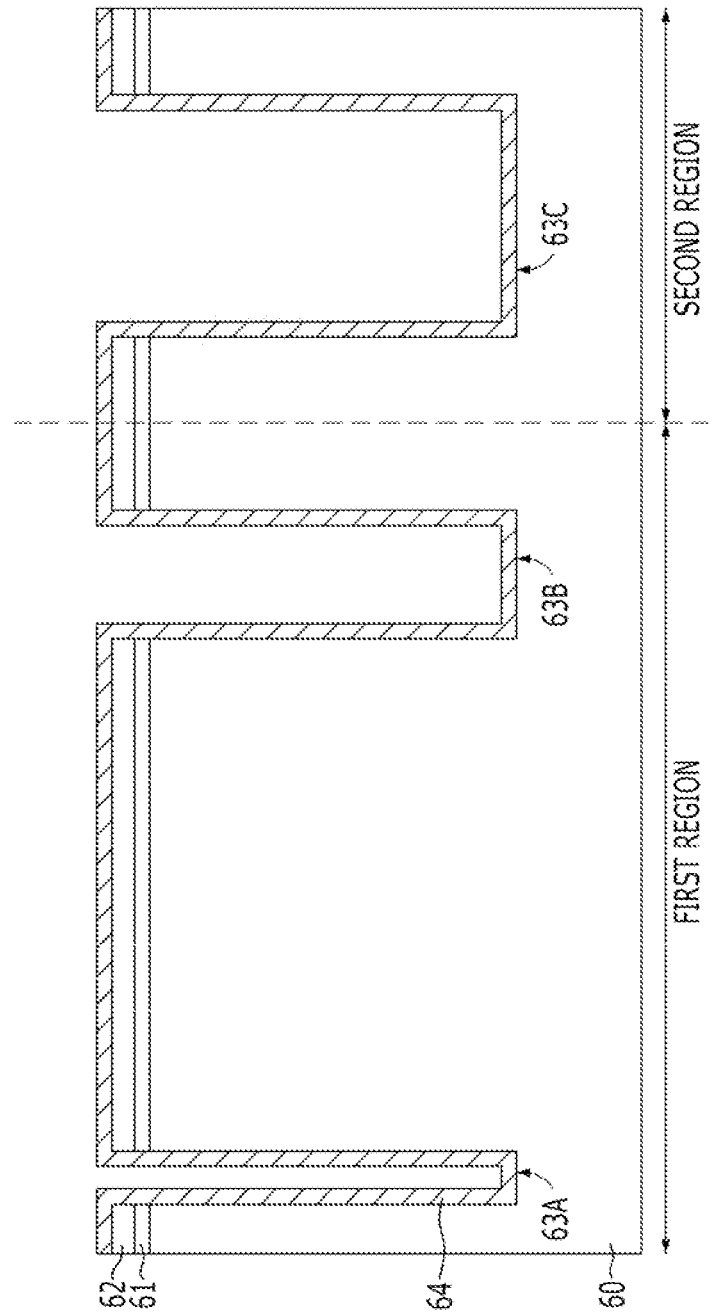

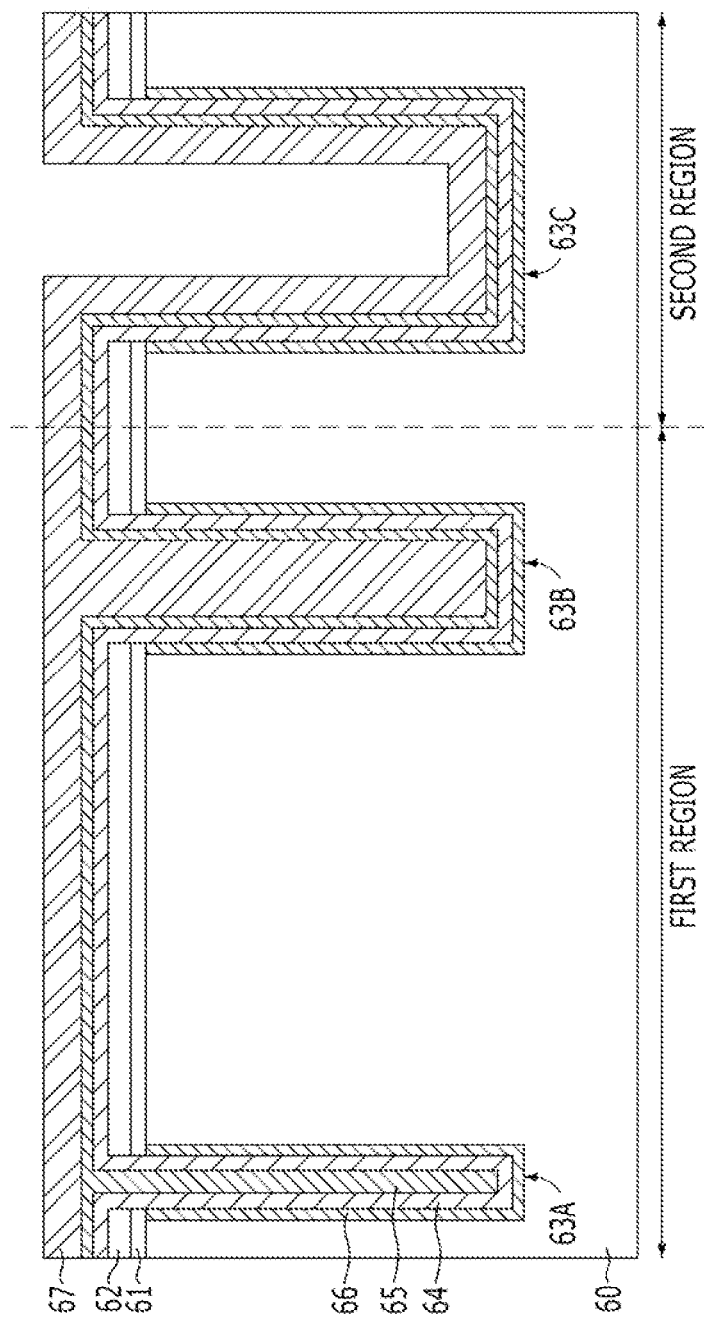

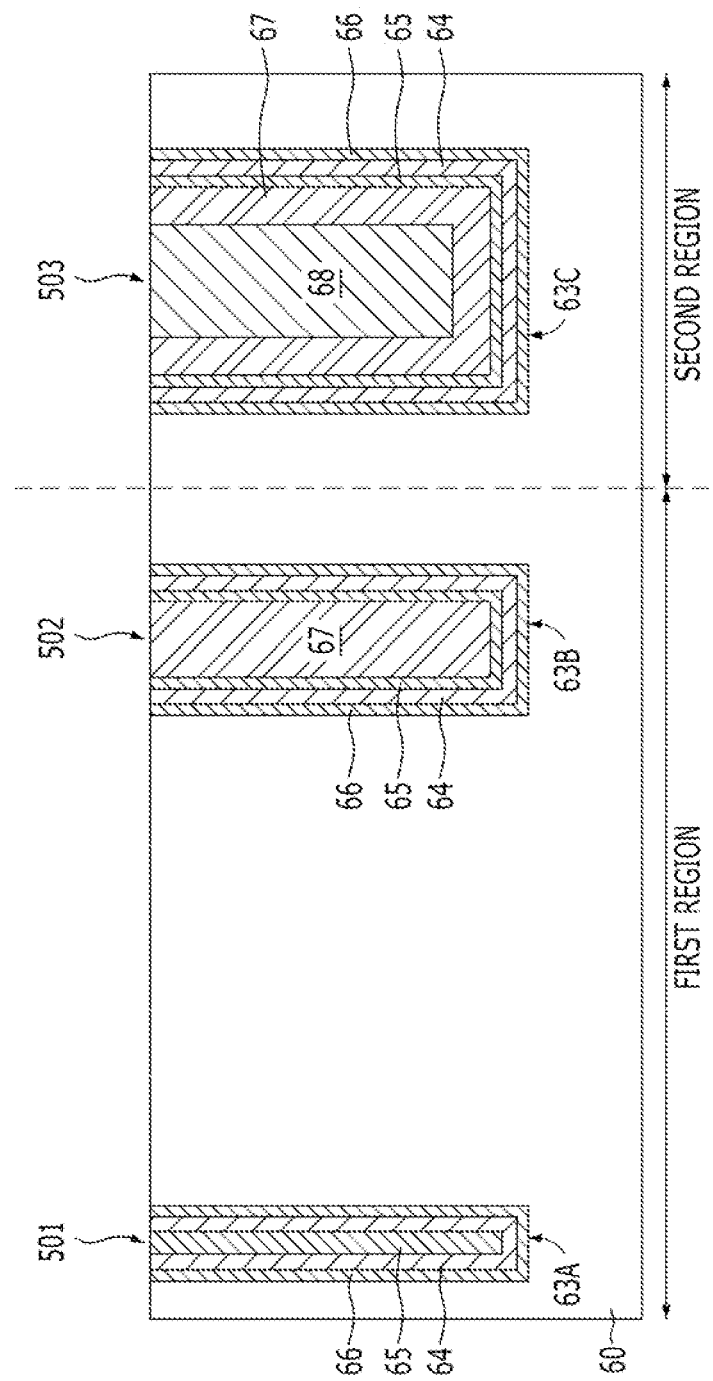

METHOD FOR FABRICATING SEMICONDUCTOR DEVICE INCLUDING ISOLATION LAYER

CROSS-REFERENCE TO RELATED APPLICATIONS

This application is a continuation of U.S. patent application Ser. No. 13/828,724 filed on Mar. 14, 2013, which claims priority of Korean Patent Application No. 10-2012-0143247, filed on Dec. 11, 2012. The disclosure of each of the foregoing application is incorporated herein by reference in its entirety.

BACKGROUND

1. Field

Exemplary implementations of the present invention relate to a semiconductor device and a method for fabricating the same, and more particularly, to a semiconductor device including an isolation layer and a method for fabricating the same.

2. Description of the Related Art

Recently, with high integration of semiconductor devices, a unit area has been significantly reduced, and the critical dimension (CD) of a pattern and a pitch between patterns have been remarkably reduced.

Although the unit area is reduced, an electrical characteristic required by a device must be continuously maintained. Therefore, the importance of an isolation layer having a small width and an excellent isolation characteristic is gradually increasing.

In general, a shallow trench isolation (STI) process is used to form an isolation layer. The STI process may be performed as follows: a trench is formed and gap-filled with an insulator to form an isolation layer. However, when the CD of the trench decreases, it is not easy to bury the insulator. In particular, when the insulator is buried, a seam or void may occur. When the seam or void occurs, a conductive material may flow into the seam or void during a subsequent process. Accordingly, a bridge or the like may be formed between adjacent patterns, thereby degrading an electrical characteristic.

SUMMARY

Various implementations are directed to a semiconductor device and a method for fabricating the same, which is capable of forming an isolation layer with no void or seam.

An exemplary semiconductor device includes a first isolation layer formed in a trench in a substrate, the isolation layer comprising a first oxide layer formed in the trench; and a second oxide layer formed over the first oxide layer, wherein the first oxide layer and the second oxide layer have a same composition.

An exemplary semiconductor device includes a substrate comprising first and second regions; a first trench formed in the first region of the substrate, the first trench having a first critical dimension (CD); a second trench formed in the second region of the substrate, the second trench having a second CD; an isolation layer formed in the first trench and in the second trench, the isolation layer comprising a first oxide layer formed in the first trench and in the second trench; a second oxide layer, having a same composition as the first oxide layer, formed on the first oxide layer, wherein the second oxide layer completely fills the first trench and the first oxide layer only partially fills the second trench; a nitride layer formed in the second trench over the second oxide layer, the nitride layer partially filling the second trench; and a fourth oxide layer formed in the nitride layer, the fourth oxide layer completely filling the second trench.

A method for fabricating an exemplary isolation layer includes forming a trench in a substrate; forming a first oxide layer in the trench; and forming a second oxide layer by oxidizing the first oxide layer.

A method for fabricating an exemplary isolation layer includes forming a first trench, having a first critical dimension (CD), in a first region of a substrate; forming a second trench, having a second CD, in a second region of the substrate; forming a first oxide layer in the first trench and in the second trench; forming a second oxide layer by oxidizing the first oxide layer, the second oxide layer completely filling the first trench and only partially filling the second trench; forming, in the second trench, a nitride layer over the second oxide layer to partially fill the second trench; and forming, in the second trench, a fourth oxide layer over the nitride layer completely fill the second trench.

BRIEF DESCRIPTION OF THE DRAWINGS

FIG. 4 is a diagram illustrating an exemplary semiconductor device having an isolation layer.

FIGS. 5A to 5G are diagrams illustrating a method for fabricating an exemplary semiconductor device having an isolation layer.

DETAILED DESCRIPTION

Figure 1:
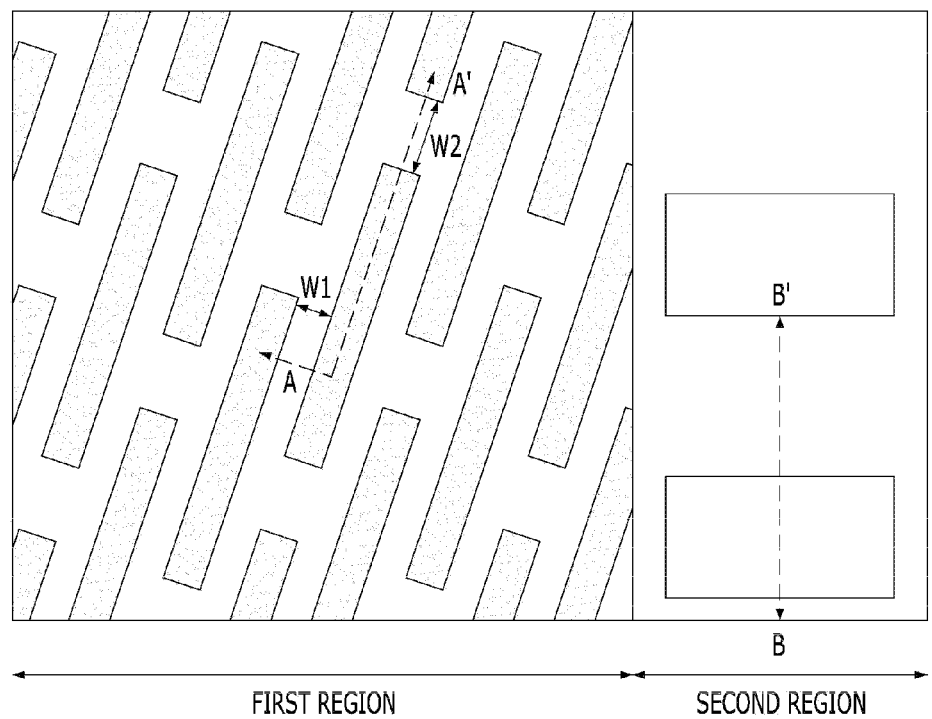
FIG. 1 is a plan view of an exemplary semiconductor device having an isolation layer.

Various implementations will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, like reference numerals refer to like parts throughout the various figures and implementations of the present invention.

The drawings are not necessarily to scale and in some instances, proportions may have been exaggerated in order to clearly illustrate features of the implementations. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a plan view of an exemplary semiconductor device having an isolation layer.

Figure 2:
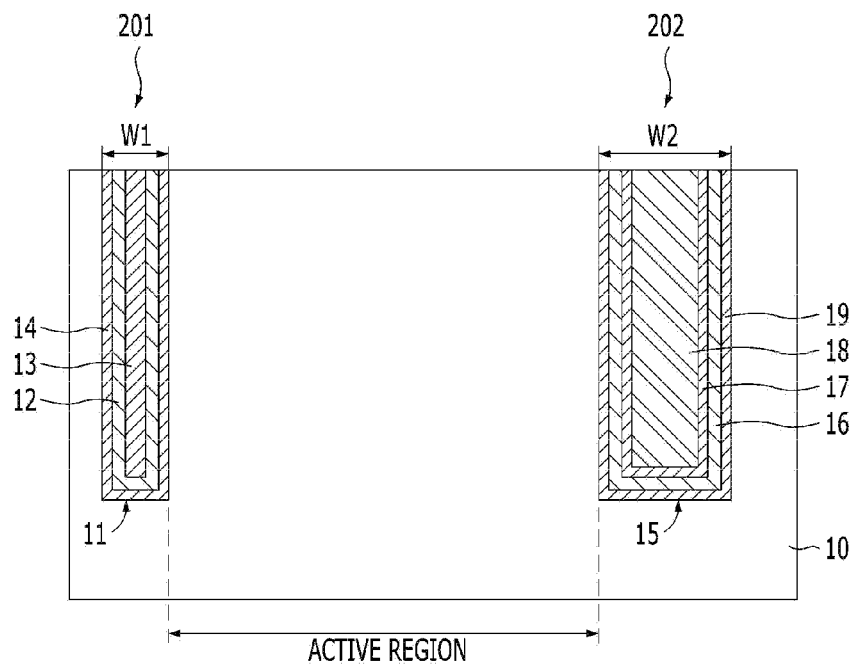
FIG. 2 illustrates an exemplary semiconductor device having an isolation layer.

FIG. 2 illustrates a semiconductor device having an isolation layer, and is a cross-sectional view taken along line A-A' of FIG. 1.

Referring to FIGS. 1 and 2, a plurality of trenches may be formed in a substrate 10. The plurality of trenches may include a first trench 11 having a first CD W1 and a second trench 15 having a second CD W2. The first trench 11 includes a first isolation layer 201 formed therein, and the second trench 15 includes a second isolation layer 202 formed therein.

The first CD W1 of the first trench 11 may have a smaller value than the second CD W2 of the second trench [[11]]15 (W1<W2).

The first isolation layer 201 may include a first insulation layer 12 formed along the surface defining the first trench 11 and a second insulation layer 13 formed over the first insulation layer 12 and filling the first trench 11. The first isolation layer 201 may further include a third insulation layer 14 formed between the substrate 10 and the first insulation layer 12. Although described below in detail, the third insulation layer 14 may be formed during the formation of the second insulation layer 13. Whether the third insulation layer 14 is to be formed or not may be decided by the formation method of the second insulation layer 13.

The first to third insulation layers 12 to 14 may be formed of an oxide. For example, the oxide may include silicon oxide.

The first insulation layer 12 may include an oxide formed through a deposition process, and the second and third insulation layers 12 and 13 may include oxide formed through an oxidation process. For example, the deposition process may include chemical vapor deposition (CVD), and the oxidation process may include a dry oxidation process.

Furthermore, the first insulation layer 12 may have a larger thickness than a thickness of the second insulation layer 13.

The first insulation layer 12 may include silicon oxide formed by CVD, and may have a thickness of about 60 Å to about 220 Å. The second insulation layer 13 is formed by a dry oxidation process, and may have a thickness of 30 about Å to about 100 Å. Meanwhile, the third insulation layer 14 may be formed during the formation process of the second insulation layer 13, and may have a smaller thickness than the thickness of the second insulation layer 13.

The second isolation layer 202 may include a fourth insulation layer 16, formed along a surface defining the second trench 15, a fifth insulation layer 17 formed on the fourth insulation layer 16, and a sixth insulation layer 18, formed over the fifth insulation layer 17, and filling the second trench 15. The second isolation layer 202 may further include a seventh insulation layer 19 formed between the substrate 10 and the fourth insulation layer 16. Although described below in detail, the seventh insulation layer 19 may be formed during the formation process of the fifth insulation layer 17. Whether the seventh insulation layer 19 is to be formed or not may be decided by the formation method of the fifth insulation layer 17.

The fourth insulation layer 16, the fifth insulation layer 17, and the seventh insulation layer 19 may include an oxide. For example, the oxide may include silicon oxide. The sixth insulation layer 18 may include a nitride. For example, the nitride may include silicon nitride.

The fourth insulation layer 16 and the sixth insulation layer 18 may be formed by a deposition process, and the fifth insulation layer 17 and the seventh insulation layer 19 may be formed by an oxidation process. For example, the deposition process may include CVD, and the oxidation process may include a dry oxidation process.

The fourth insulation layer 16 may have a larger thickness than a thickness of the fifth insulation layer 17. Furthermore, the sixth insulation layer 18 may have a larger thickness than a thickness of the fourth insulation layer 16.

The fourth insulation layer 16 may include a high-temperature oxide (HTO) layer formed by CVD, and may have a thickness of about 60 Å to about 220 Å. The fifth insulation layer 17 may include an oxide formed by a dry oxidation process, and may have a thickness of about 30 Å to about 100 Å. The sixth insulation layer 18 may include nitride formed by CVD, and may have a thickness of about 200 Å to 500 Å. Meanwhile, the seventh insulation layer 19 may be formed during the formation process of the fifth insulation layer 17, and may have a smaller thickness than the thickness of the fifth insulation layer 17.

The first to third insulation layers 12 to 14, formed in the first trench 11, may have the same materials, thicknesses, and stacked structure as the fourth to seventh insulation layers 16 to 19, formed in the second trench 15. Furthermore, as described below in detail, the first to third insulation layers 12 to 14, formed in the first trench 11, may be formed at the same time as the fourth to seventh insulation layers 16 to 19, formed in the second trench 12.

In the semiconductor device having the above-described structure, the first isolation layer 201 includes the first and second insulation layers 12 and 13, and the first and second insulation layers 12 and 13 are formed of the same material. Accordingly, a seam may be prevented from occurring in the isolation layer.

Furthermore, the first and second insulation layers 12 and 13 may be provided to more effectively cure damage which may occur on the substrate surface during the trench formation process for isolation.

In the semiconductor device having the above-described structure, the first isolation layer 201 includes the first and second insulation layers 12 and 13, and the second isolation layer 202 includes the fourth to seventh insulation layers 16 to 19. Therefore, an active region defined by the first and second isolation layers 201 and 202 may be prevented from being bent.

Furthermore, a reduction in the area of the active region may be prevented from occurring during the isolation layer formation process.

FIGS. 3A to 3F are diagrams illustrating a method for fabricating an exemplary semiconductor device having an isolation layer. FIGS. 3A to 3F are cross-sectional views taken along line A-A' of FIG. 1.

Figure 3A:
FIGS. 3A to 3F are diagrams illustrating a method for fabricating an exemplary semiconductor device having an isolation layer.

Referring to FIG. 3A, a substrate 30 is provided. The substrate 30 may have a single crystal state, and include a silicon containing material. For example, the substrate 30 may include a silicon substrate or a silicon-on-insulator (SOI) substrate.

A pad layer 31A and a hard mask layer 32A are sequentially formed over the substrate 30. The pad layer 31A may be formed of silicon oxide. The pad layer 31A may be formed by thermally oxidizing the top part of the substrate 30. Meanwhile, the hard mask layer 32A may include an oxide, a nitride, an oxy-nitride, a carbon containing layer, a semiconductor layer or, a combination thereof. For example, the hard mask layer 32A may include a sequential stack of a nitride, an oxide, a silicon oxide, and carbon.

Figure 3B:
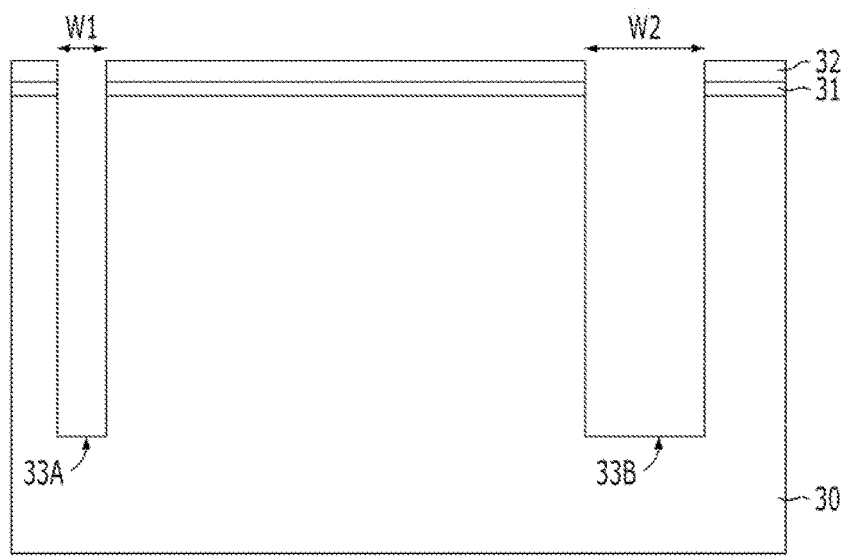

Referring to FIG. 3B, the hard mask layer 32A is patterned through a photoresist layer (not illustrated) so as to form a hard mask layer pattern 32. Furthermore, the hard mask layer pattern 32 is used as an etch mask to etch the pad layer 31A and the top part of the substrate 30, thereby forming a pad layer pattern 31 and forming a plurality of trenches 33a and 33b for isolation in the substrate 30. At this time, the plurality of trenches 33a and 33b may include a first trench 33A having a first CD W1 and a second trench 33B having a second CD W2.

Here, the first CD W1 of the first trench 33A may have a smaller value than the second CD W2 of the second trenches 33B (W1<W2).

Figure 3C:
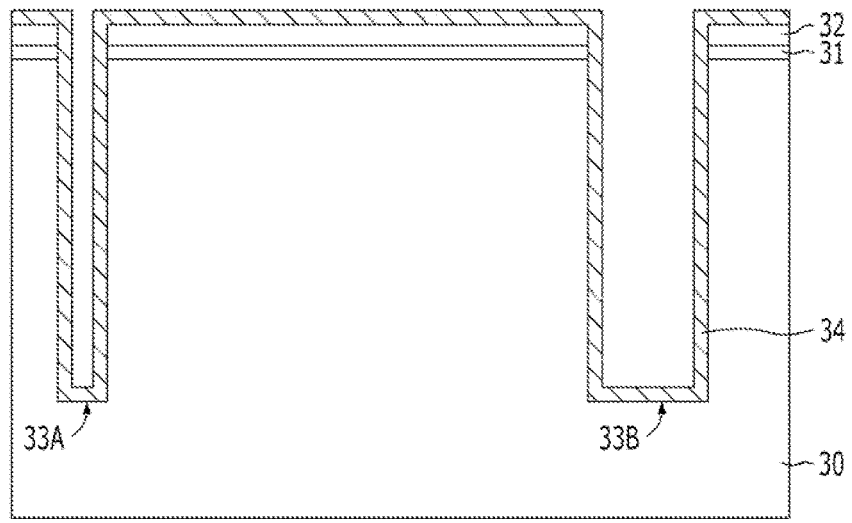

Referring to FIG. 3C, a first insulation layer 34 is formed along the surface of the structure defining the first and second trenches 33A and 33B. The first insulation layer 34 is formed to a thickness that does not completely fill the first and second trenches 33A and 33B. The first insulation layer 34 may be formed to have a thickness of about 60 Å to about 220 Å. The first insulation layer 34 may conformally cover the sidewalls and bottom surfaces that define the first and second trenches 33A and 33S.

The first insulation layer 34 may be formed of an oxide. For example, the oxide may include silicon oxide.

The first insulation layer 34 may be formed by CVD. Specifically, the first insulation layer 34 may be formed by low pressure CVD (LPCVD). The first insulation layer 34 serves as a barrier layer to prevent the area of an active region from being reduced when subsequent second and third insulation layers 35 and 36 are formed through an oxidation process by consuming the substrate.

The first insulation layer 34 may be formed at a temperature of about 700° C. or more. Specifically, the first insulation layer 34 may be formed at a temperature of about 700° C. to 850° C. This is in order to cure damage on the substrate surface, which may occur during the trench formation process.

The first insulation layer 34 may be formed by LPCVD, and the temperature may be controlled to form the first insulation layer 34 using silicon oxide. Therefore, the first insulation layer 34 may be formed of silicon oxide by LPCVD. The high-temperature oxide may be formed by reacting silicon source gas and oxygen gas at a flow about of 1:1 under a temperature condition of about 700° C. to 850° C. The silicon source gas may include silane gas ($SiH_4$) or DCS (DiChloroSilane, $SiH_2Cl_2$), and the oxygen source gas may include $N_2O$ or $O_3$.

Meanwhile, the first insulation layer 34 may be formed by atomic layer deposition (ALD).

Figure 3D:
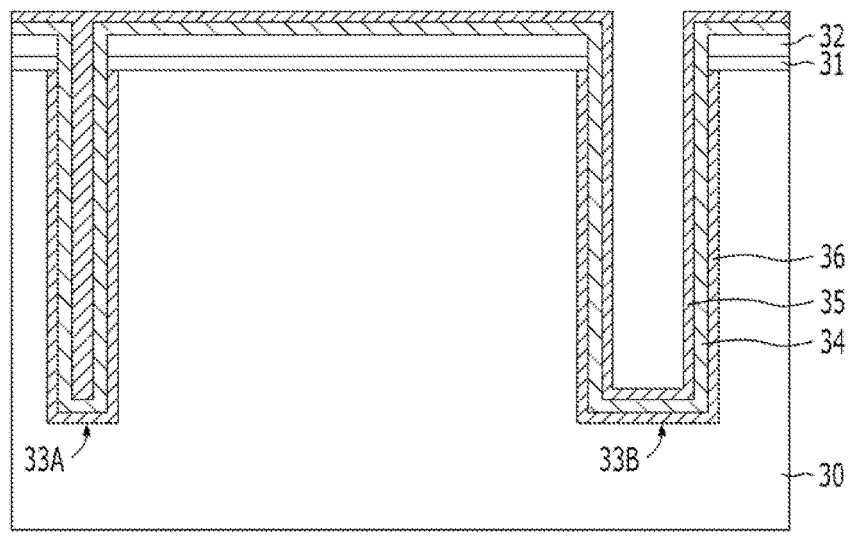

Referring to FIG. 3D, a second insulation layer 35 is formed along a surface of the structure including the first insulation layer 34. At this time, the second insulation layer 35 is formed over the first insulation layer 34. The second insulation layer 35 may be formed to have a thickness of about 30 Å to about 100 Å at a temperature of about 700° C. to about 900° C.

The second insulation layer 35 may be formed of an oxide. For example, the oxide may include silicon oxide.

The second insulation layer 35 may be formed by an oxidation process, and the oxidation process may include a dry oxidation process, a wet oxidation process, a plasma oxidation process, and a radical oxidation process. For example, the second insulation layer 35 may be formed by a dry oxidation process. The reason to use the dry oxidation process is that the dry oxidation process can expand the volume more than the other oxidation processes and can easily control the thickness. Accordingly, when the dry oxidation process is used to form the second insulation layer 35 in an oxygen atmosphere, oxygen is combined with the silicon of the first insulation layer 34, so that the second insulation layer 35 fills the rest of the first trench 33A over the first insulation layer 34, thereby preventing a seam from occurring in the trench having a small CD. The first insulation layer 34 is formed in the first trench 33A, and then oxidized to form the second insulation layer that fills the first trench 33A, thereby the occurrence of the seam. Accordingly, when a buried gate is subsequently formed, a conductive material does not flow into the first trench. Therefore, it is possible to prevent a bridge from being formed between the buried gates.

When the first insulation layer 34 is formed, a part of the substrate 30 adjacent to the first and second trenches 33A and 33B may be oxidized to from a third insulation layer 36. The third insulation layer 35 may be formed when the second insulation layer 35 is formed. The third insulation layer 36 may be formed of an oxide. For example, the oxide may include silicon oxide. The third insulation layer 36 may have a smaller thickness than if the substrate surface were directly oxidized. Accordingly, the area of the active region may be prevented from being reduced when an isolation layer is formed. Furthermore, damage on the surface of the substrate 30, which may occur during the formation process of the plurality of trenches 33A and 33 for isolation, may be effectively cured.

Figure 3E:
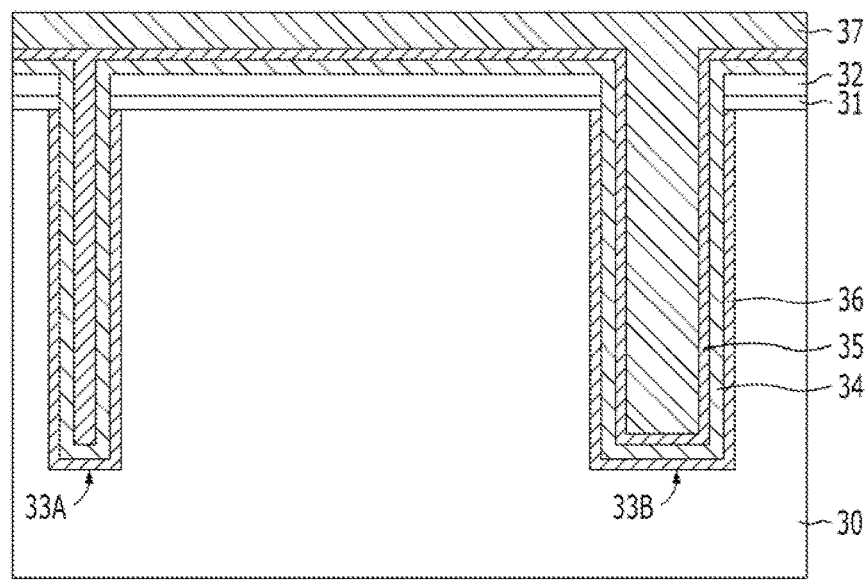

Referring to FIG. 3E, a fourth insulation layer 37 is formed along a surface of the structure, including the second insulation layer 35. At this time, the fourth insulation layer 37 covers the top of the first trench 33A, and fills the second trench 33B over the second insulation layer 35. The fourth insulation layer 37 may be formed to have a thickness of about 200 Å to about 500 Å.

The fourth insulation layer 37 may include an oxide, a nitride, or an oxynitride. For example, the fourth insulation layer 37 may be formed of nitride. For example, the nitride may include silicon nitride.

The fourth insulation layer 37 may be formed by CVD. The fourth insulation layer 37 may be formed by reacting silicon source gas and nitrogen source gas at a ratio of about 1:10 under a temperature condition of about 650° C. to about 750° C. The silicon source gas may include $SiH_4$ and $SiH_2Cl_2$, and the nitrogen source gas may include ammonia ($NH_3$).

Meanwhile, the fourth insulation layer 37 may be formed by ALD.

Figure 3F:
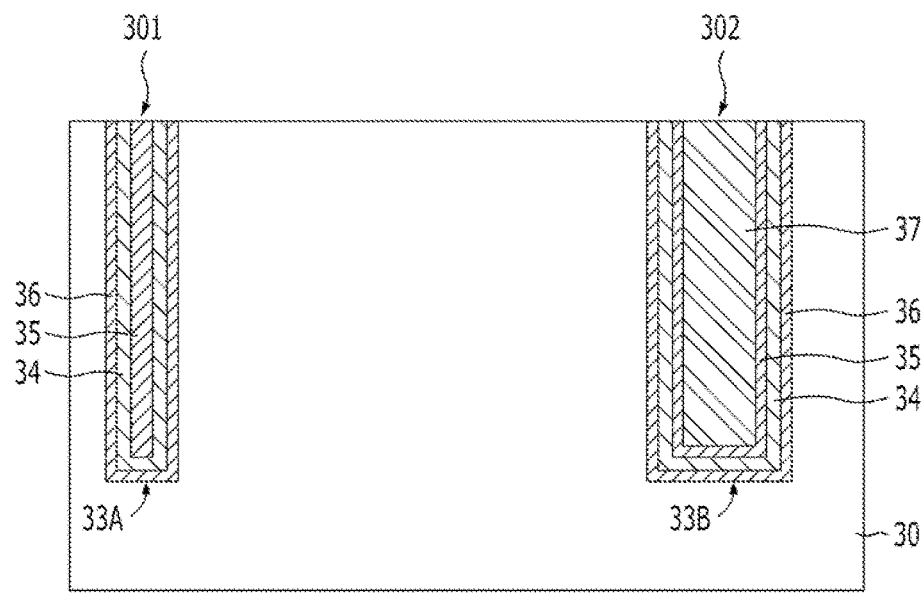

Referring to FIG. 3F, a planarization process is performed until the surface of the substrate 30 is exposed, thereby forming first and second isolation layers 301 and 302. The planarization process may include chemical mechanical polishing (CMP).

The first isolation layer 301, which fills the first trench 33A, may include a first insulation layer pattern 34 and a second insulation layer pattern 35 formed on the first insulation layer pattern 34. The second isolation layer 302, which fills the second trench 331, may include the first insulation layer pattern 34, the second insulation layer pattern 35, and a fourth insulation layer pattern 37. The first and second isolation layers 301 and 302 may further include a third insulation layer pattern 36 between the substrate 30 and the first insulation layer pattern 34.

The first isolation layer 301 includes the first and second insulation layers 34 and 35, which are formed of an oxide. The second isolation layer 302 includes the first and second insulation layers 34 and 35, which are formed of oxide, and the fourth insulation layer 37, which is formed of nitride. Therefore, stress applied to the active region may be balanced to prevent the active region from being bent.

FIG. 4 is a diagram illustrating an exemplary semiconductor device having an isolation layer. FIG. 4 includes first and second regions. The first region corresponds to a cross-sectional view taken along line A-A' of FIG. 1, and the second region corresponds to a cross-sectional view taken along line B-B' of FIG. 1.

Referring to FIGS. 1 and 4, a substrate 40 may include the first and second regions. The first region may include a plurality of trenches. The plurality of trenches may include a first trench 41 having a first CD W1 and a second trench 42 having a second CD W2. The second region may include a third trench 50 having a third CD W3.

The first trench 41 includes a first isolation layer 401 formed therein, the second trench 45 includes a second isolation layer 402 formed therein, and the third trench 50 includes a third isolation layer 403 formed therein.

If the exemplary semiconductor device is a DRAM, the first region may correspond to a cell region, and the second region may correspond to a peripheral circuit region. Furthermore, the first CD W1 of the first trench 41 may be smaller than the second CD W2 of the second trench 45, and the second CD W2 may be smaller than the third CD W3 (W1<W2<W3).

The first isolation layer 401 may include a first insulation layer 42, formed along a surface defining the first trench 41, and a second insulation layer 43, formed over the first insulation layer 42, to fill the first trench 41. The first isolation layer 401 may further include a third insulation layer 44 formed between the substrate 40 and the first insulation layer 42. As described below in detail, the third insulation layer 44 may be formed when the second insulation layer 43 is formed. Whether the third insulation layer 44 is to be formed or not may be decided by the formation method of the second insulation layer 43.

The first to third insulation layers 42 to 44 may be formed of an oxide. For example, the oxide may include silicon oxide.

The first insulation layer 42 may include an oxide formed by a deposition process, and the second and third insulation layers 43 and 44 may include an oxide formed by an oxidation process. For example, the deposition process may include CVD, and the oxidation process may include a dry oxidation process.

Furthermore, the first insulation layer 42 may have a larger thickness than the second insulation layer 43.

The first insulation layer 42 may include silicon nitride formed by CVD, and may have a thickness of about 60 Å to about 220 Å. The second insulation layer 43 may be formed by a dry oxidation process, and may have a thickness of about 30 Å to about 100 Å.

Meanwhile, the third insulation layer 44 may be formed during the formation process of the second insulation layer 43, and may have a smaller thickness than the thickness of the second insulation layer 43.

The second isolation layer 402 may include a fourth insulation layer 46, formed along the second trench 45, a fifth insulation layer 47, formed on the fourth insulation layer 46, and a sixth insulation layer 48, formed on the fifth insulation layer 47, to fill the second trench [[20]]445. Furthermore, the second isolation layer 402 may further include a seventh insulation layer 49 formed between the substrate 40 and the fourth insulation layer 46. Although described below in detail, the seventh insulation layer 49 may be formed during the formation process of the fifth insulation layer 47. Whether the seventh insulation layer 49 is to be formed or not may be decided by the formation method of the fifth insulation layer 47.

The fourth to seventh insulation layers 46 to 49 may be formed of an oxide. For example, the oxide may include silicon oxide. The sixth insulation layer 48 may be formed of a nitride. For example, the nitride may include silicon nitride.

The fourth and sixth insulation layers 46 and 48 may be formed by a deposition process, and the fifth and seventh insulation layers 47 and 49 may be formed by an oxidation process. For example, the deposition process may include CVD, and the oxidation process may include a dry oxidation process.

The fourth insulation layer 46 may have a larger thickness than the thickness of the fifth insulation layer 47, and the sixth insulation layer 48 may have a larger thickness than a thickness of the fourth insulation layer 46.

The fourth insulation layer 46 may include silicon nitride formed by CVD, and may have a thickness of about 60 Å to about 220 Å. The fifth insulation layer 47 may include an oxide formed by a dry oxidation process, and may have a thickness of about 30 Å to about 100 Å. The sixth insulation layer 48 may include a nitride formed by CVD, and may have a thickness of about 200 Å to about 500 Å. Meanwhile, the seventh insulation layer 49 may be formed during the formation process of the fifth insulation layer 47, and may have a smaller thickness than the thickness of the fifth insulation layer 47.

The third isolation layer 403 may include an eighth insulation layer 51 formed along a surface that defines the third trench 50, a ninth insulation layer 52 formed on the eighth insulation layer 51, a tenth insulation layer 53 formed on the ninth insulation layer 52, and an eleventh insulation layer 54 formed on the tenth insulation layer 53 to fill the rest of the third trench [[45]]50. Furthermore, the third insulation layer 403 may further include a twelfth insulation layer 55 formed between the substrate 40 and the eighth insulation layer 51. Although described below in detail, the twelfth insulation layer 55 may be formed during the formation process of the ninth insulation process 52. Whether the twelfth insulation layer 55 is to be formed or not may be decided by the formation method of the ninth insulation layer 52.

The eighth, ninth, and twelfth insulation layers 51, 52, and 55 may be formed of an oxide. For example, the oxide may include silicon oxide. The tenth insulation layer 53 may include a nitride. For example, the nitride may include silicon nitride. The eleventh insulation layer 54 may include an oxide. For example, the oxide may include polysilazane based spin-on-dielectric (SOD).

The eighth and tenth insulation layers 51 and 53 may be formed by a deposition process, the ninth and twelfth insulation layers 52 and 52 may be formed by an oxidation process, and the eleventh insulation layer 54 may be formed by a spin coating process. For example, the deposition process may include CVD, and the oxidation process may include a dry oxidation process.

The eighth insulation layer 51 may have a larger thickness than the ninth insulation layer 55, the tenth insulation layer 53 may have a larger thickness than a thickness of the eighth insulation layer 51, and the eleventh insulation layer 54 may have a larger thickness than a thickness of the tenth insulation layer 53.

The eighth insulation layer 51 may include silicon nitride formed by CVD, and may have a thickness of about 60 Å to about 220 Å. The ninth insulation layer 52 may include oxide formed by a dry oxidation process, and may have a thickness of about 30 Å to about 100 Å. The tenth insulation layer 53 may include nitride formed by CVD, and may have a thickness of about 200 Å to about 500 Å. Furthermore, the eleventh insulation layer 54 may include SOD formed by a spin coating method. Meanwhile, the twelfth insulation layer 55 may be formed during the formation process of the ninth insulation layer 52, and may have a smaller thickness than the thickness of the ninth insulation layer 52.

The eighth to tenth insulation layers 51 to 53, which are formed in the third trench 50, may have the same materials, thicknesses, and stacked structure as the first to third insulation layers 42 to 44, which are formed in the first trench 41, and the fourth, fifth, and seventh insulation layers 46, 47, and 49, which are formed in the second trench 45.

In an exemplary semiconductor device having the above-described structure, the first isolation layer 401, which is formed in the first trench 41, includes the first and second insulation layers 42 and 43, which are formed of the same material—thereby preventing a seam from occurring in the isolation layer. Furthermore, the first and second insulation layers 42 and 43 are provided to prevent damage which may occur on the substrate surface during the trench formation process.

Furthermore, the first isolation layer 401 of the first region includes the first and second insulation layers 42 and 43 formed of oxide layer, and the second isolation layer 402 of the first region includes the fourth to seventh insulation layers 46 to 49 formed of oxide layer. Therefore, the active region of the cell region defined by the first and second isolation layers 401 and 402 having a lower stress may be prevented from being bent.

Furthermore, the area of the active region may be prevented from being reduced during the formation process of the isolation layer.

Furthermore, since the third isolation layer 403 formed in the second region has a structure in which the eighth, ninth, and twelfth insulation layers 51, 52, and 55 formed of oxide are stacked, a wall oxide thickness required by the semiconductor device may be easily secured to thereby improve hot electron induced punch through (HEIP).

FIGS. 5A to 5G are diagrams illustrating a method for fabricating an exemplary semiconductor device having an isolation layer. Each of FIGS. 5A to 5G includes first and second regions. The first region corresponds to a cross-sectional view taken along line A-A' of FIG. 1, and the second region corresponds to a cross-sectional view taken along line B-B' of FIG. 1.

Referring to FIG. 5A, a substrate 60 including the first and second regions is provided. If an exemplary semiconductor device is a DRAM, then the first region may correspond to a cell region where memory cells are formed, and the second region may correspond to a peripheral circuit region where peripheral circuits are formed. The substrate 60 may have a single crystal state, and may include a silicon containing material. For example, the substrate 60 may include a silicon substrate or SOI substrate.

Then, a pad layer 61A and a hard mask layer 62A are sequentially stacked over the substrate 60. The pad layer 61A may be formed by using silicon oxide. The pad layer 61A is formed by thermally oxidizing the top part of the substrate 60. Meanwhile, the hard mask layer 62A may include an oxide, a nitride, an oxynitride, a carbon containing layer, a semiconductor layer, or a combination thereof. For example, the hard mask layer 62A may include a sequential stack of a nitride, an oxide, a silicon oxynitride, and carbon.

Referring to FIG. 5B, the hard mask layer 62A formed over the substrate 60 is patterned through a photoresist layer (not illustrated) so as to form a hard mask layer pattern 62. The hard mask layer pattern 62 is used as an etch mask to etch the pad layer 61A and the top part of the substrate 60. Accordingly, a pad layer pattern 61 is formed, and a plurality of trenches 63A, 63B, and 63C for isolation are formed in the respective regions of the substrate 60. At this time, the plurality of trenches 63A, 63B, and 63C may include a first trench 63A having a first CD W1, a second trench 63B having a second CD W2, and a third trench 63C having a third CD W3. The first and second trenches 63A and 63B are formed in the first region, and the third trench 63C is formed in the second region.

The first to third trenches 63A to 63C may have different CDs depending on a difference in a density of the unit components formed in the respective regions. Specifically, the first CD W1 may have the smallest value, and the third CD W2 may have the largest value (W1<W2<W3).

Referring to FIG. 5C, a first insulation layer 64 is formed along the surface of a structure including the first to third trenches 63A to 63C. The first insulation layer 64 is formed to a thickness that does not completely fill the first to third trenches 63A to 63C. The first insulation layer 64 may be formed to have a thickness of about 60 Å to about 220 Å. The first insulation layer 64 may conformally cover the sidewalls and bottom surfaces that define the first to third trenches 63A to 63C.

The first insulation layer 64 may be formed of an oxide. For example, the oxide may include silicon oxide.

The first insulation layer 64 may be formed by CVD. Specifically, the first insulation layer 64 may be formed by LPCVD. The first insulation layer 64 serves to prevent the area of an active region from being reduced when a subsequent second insulation layer 65 is formed.

The first insulation layer 64 may be formed at a temperature of about 700° C. or more. Specifically, the first insulation layer 64 may be formed at a temperature of about 700° C. to 850° C. This is in order to minimize damage to the surface of the substrate 60, which may occur during the trench formation process.

The first insulation layer 64 may be formed by LPCVD, and the temperature may be controlled to form the first insulation layer 64 using silicon oxide. Therefore, the first insulation layer 64 may be formed of silicon nitride by LPCVD. The high-temperature oxide may be formed by reacting silicon source gas and oxygen source gas at a ratio of about 1:1 at a temperature of about 700° C. to 850° C. The silicon source gas may include $SiH_4$ or $SiH_2Cl_2$, and the oxygen source gas includes $N_2O$ or $O_3$.

Meanwhile, the first insulation layer 64 may be formed by ALD.

Figure 5D:
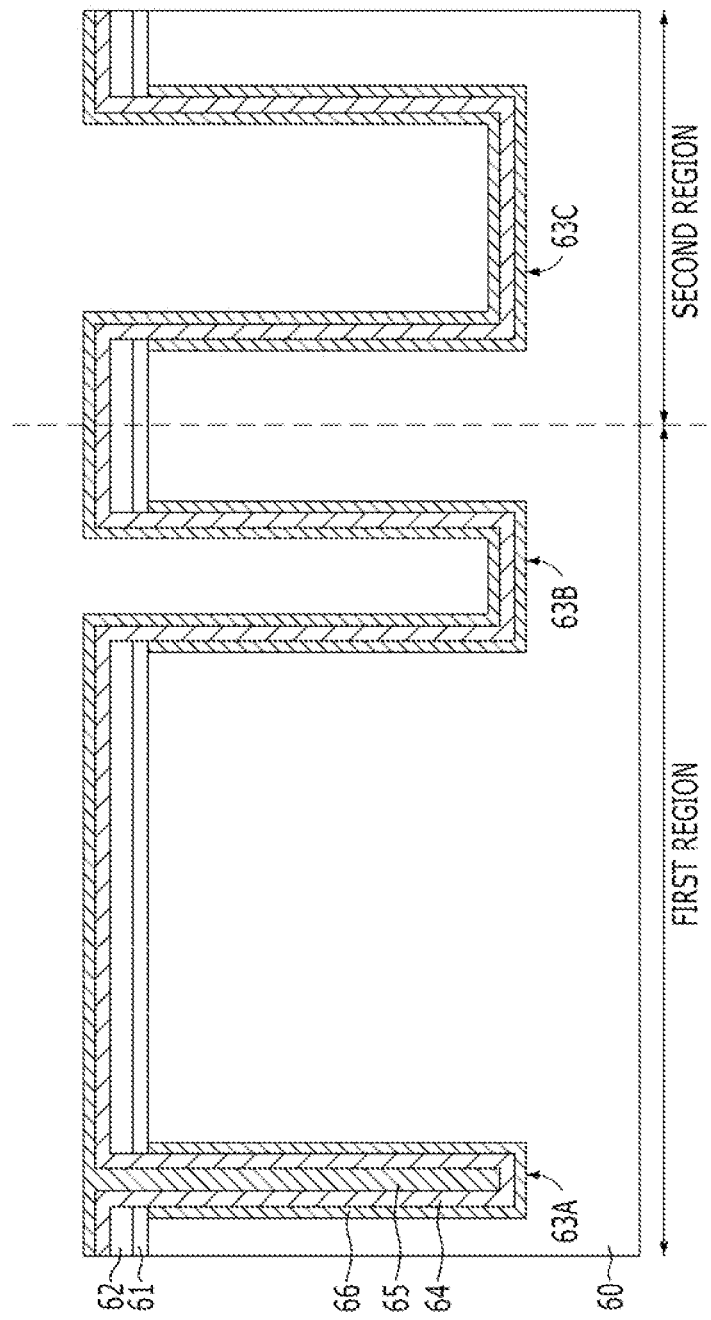

Referring to FIG. 5D, a second insulation layer 65 is formed along the surface of the structure including the first insulation layer 64. At this time, the second insulation layer 65 is formed to gap-fill the first trench 63A, but to not gap-fill the second and third trenches 63B and 63C. The second insulation layer 65 may be formed at a temperature of about 700° C. to about 900° C. so as to have a thickness of about 30 Å to about 100 Å. The third insulation layer 66 may formed of an oxide. For example, the oxide may include silicon oxide. The second insulation layer 65 may be formed by an oxidation process, and the oxidation process may include a dry oxidation process, a wet oxidation process, a plasma oxidation process, and a radical oxidation process. For example, the second and third insulation layers 65 and 66 may be formed by a dry oxidation process. The reason to use the dry oxidation process is that the dry oxidation process can expand the volume more than the other oxidation processes and can easily control the thickness. Accordingly, when the dry oxidation process is used to form the second insulation layer 65 under in oxygen atmosphere, oxygen is combined with the silicon of the first insulation layer 64, so that the second insulation layer 65 fills the rest of the first trench 63A over the first insulation layer 64, thereby preventing a seam from occurring in the trench having a small CD. That is, the first insulation layer 64 is formed along the surfaces of the first to third trenches 63A to 63C, and then oxidized to fill the first trench 63A with the second insulation layer 65. Accordingly, the occurrence of the seam may be fundamentally blocked. Therefore, since a conductive material does not flow into the trench when a subsequent buried gate is formed, it is possible to prevent a bridge from being formed between buried gates.

Furthermore, when the first insulation layer 64 is formed, a part of the substrate 30 adjacent to the first to third trenches 63A to 63C is oxidized to form a third insulation layer 66. The third insulation layer 66 may be formed when the second insulation layer 65 is formed. The third insulation layer 66 may be formed of an oxide. For example, the oxide may include silicon oxide. The oxide may be formed to a smaller thickness than if the substrate surface where directly oxidized. Accordingly, it is possible to prevent the area of the active region from being reduced during the isolation layer formation process. Furthermore, it is possible to more effectively cure damage which may occur on the surface of the substrate 60 when the first to third trenches 63A to 63C for isolation are formed.

Referring to FIG. 5E, a fourth insulation layer 67 is formed along a surface of the structure including the second insulation layer 65. The fourth insulation layer 67 covers the top of the first trench 63A, fills the rest of the second trench 63B over the second insulation layer 65, and does not fill the third trench 63C. That is, the fourth insulation layer 67 is formed along a surface defining the third trench 63C. The fourth insulation layer 67 may be formed to have a thickness of about 200 Å to about 500 Å.

The fourth insulation layer 67 may be formed of a nitride. For example, nitride may include silicon nitride.

The fourth insulation layer 67 may be formed by CVD. The fourth insulation layer 67 may be formed by reacting silicon source gas and nitrogen source gas at a ratio of about 1:10 under a temperature condition of about 650° C. to about 750° C. The silicon source gas may include $SiH_4$ or $SiH_2Cl_2$, and the nitrogen source gas may include $NH_3$.

Meanwhile, the fourth insulation layer 67 may be formed by ALD.

Figure 5F:
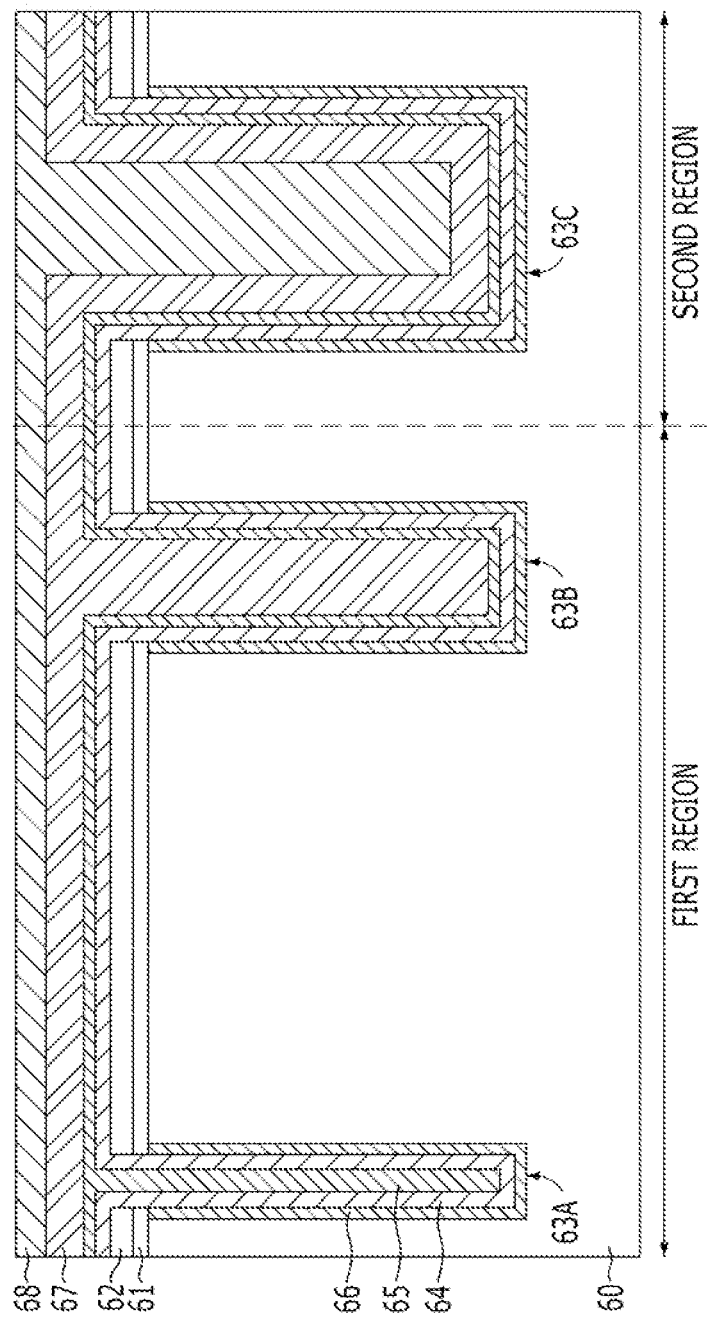

Referring to FIG. 5F, a fifth insulation layer 68 is formed on the fourth insulation layer 67 to gap-fill the third trench 63C. The fifth insulation layer 68 may be formed of an oxide, a nitride, or an oxynitride.

The fifth insulation layer 68 may include a SOD, formed by a spin coating method, in order to secure a gap-fill characteristic in the third trench 63C. For example, if the fifth insulation layer 68 is formed of oxide, then a polysilazane-based SOD may be used.

Meanwhile, if the fifth insulation layer 68 is formed of SOD, then an anneal process may be performed after the deposition process, in order to improve a film quality.

Referring to FIG. 5G, a planarization process is performed until the surface of the substrate 60 is exposed, thereby forming first to third isolation layers 501 to 503 in the respective regions. The planarization process may include CMP.

The first isolation layer 501, which is formed in the first trench 63A, includes a first insulation layer pattern 64 and a second insulation layer pattern 65. The second isolation layer 502, which is formed in the second trench 63B, includes the first insulation layer pattern 64, the second insulation layer pattern 65, and a third insulation layer pattern 66. The third isolation layer 503, which is formed in the third trench 63C, includes the first insulation layer pattern 64, the second insulation layer pattern 65, the fourth insulation layer pattern 67, and a fifth insulation layer pattern 68. Furthermore, the first to third isolation layers 501, 502, and 503 may further include a third insulation layer pattern 66 formed between the substrate 60 and the first insulation layer pattern 64.

The first isolation layer 501 includes the first and second insulation layers 64 and 65, which are formed of an oxide, and the second isolation layer 502 includes the first and second insulation layers 64 and 65, which are formed of an oxide, and the fourth insulation layer 67, which are formed of nitride. Therefore, stress applied to the active region may be balanced to prevent the active region from being bent.

Furthermore, since the third isolation layer 503 includes the first to third insulation layers 64 to 66, which are formed of an oxide, a wall oxide thickness required by the semiconductor device may be easily provided to improve HEIP.

Figure 6:
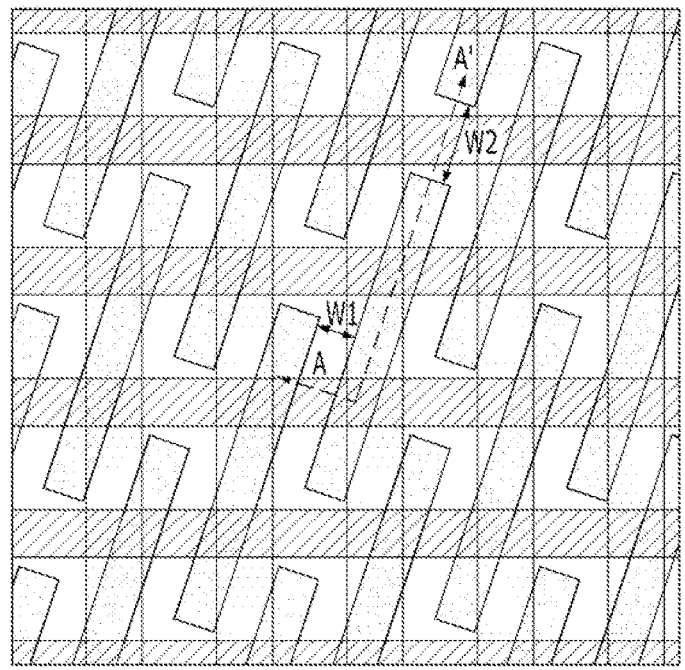
FIG. 6 is a plan view of an exemplary semiconductor device having a buried gate.

FIG. 6 is a plan view of an semiconductor device having a buried gate.

Figure 7:
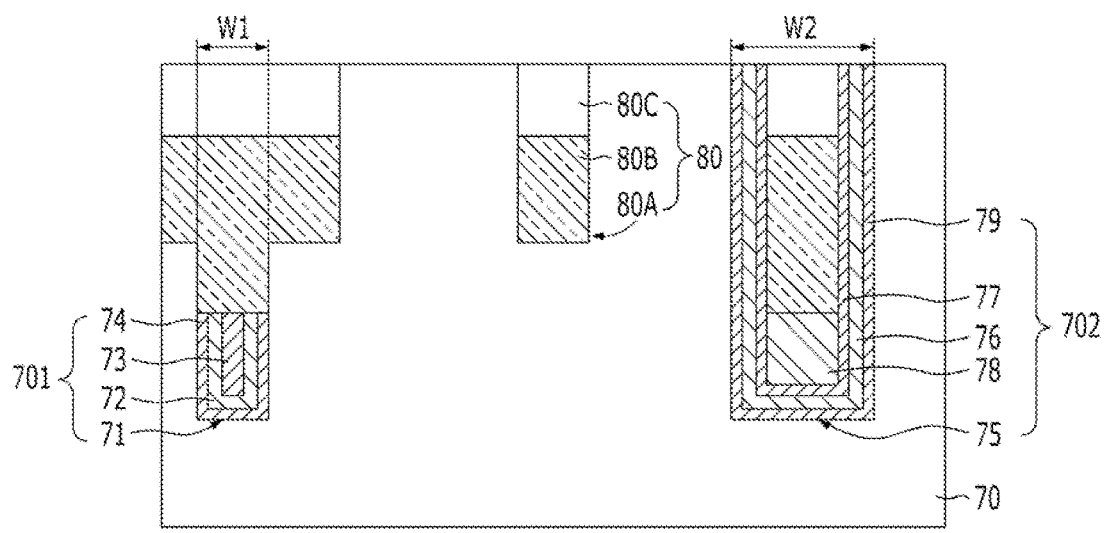
FIG. 7 illustrates the semiconductor device having a buried gate in accordance with the third implementation of the present invention.

FIG. 7 illustrates an exemplary semiconductor device having a buried gate, and is a cross-sectional view taken along line A-A' of FIG. 6.

Referring to FIGS. 6 and 7, a plurality of trenches may be formed in the substrate 70. The plurality of trenches may include a first trench 71 having a first CD W1 and a second trench 75 having a second CD W2. The first trench 71 includes a first isolation layer 701 formed therein, and the second trench 75 includes a second isolation layer 702 formed therein. Furthermore, the semiconductor device may include a plurality of buried gate structures 80 crossing the substrate 70, including the first isolation layer 701, the second isolation layer 702, and an active region defined by the first and second isolation layers 701 and 702.

The first CD W1 of the first trench 71 may be smaller than the second CD W2 of the second trench 75 (W1<W2).

The first isolation layer 701 includes a first insulation layer 72, formed along a surface defining the first trench 71, and a second insulation layer 73, formed on the first insulation layer 72 to fill the rest of the first trench 71. The first isolation layer 701 may further include a third insulation layer 74 formed between the substrate 70 and the first insulation layer 72. Although described below in detail, the third insulation layer 74 may be formed during the formation process of the second insulation layer 73. Whether the third insulation layer 74 is to be formed or not may be decided by the formation method of the second insulation layer 73.

The first to third insulation layers 72 to 74 may be formed of an oxide. For example, the oxide may include silicon oxide.

The first insulation layer 72 may include an oxide formed by a deposition process, and the second and third insulation layers 73 and 74 may include an oxide formed by an oxidation process. For example, the deposition process may include CVD, and the oxidation process may include a dry oxidation process.

The first insulation layer 72 may have a larger thickness than a thickness of the second insulation layer 73.

The first insulation layer 72 may include silicon nitride formed by CVD, and may have a thickness of about 60 Å to about 220 Å. The second insulation layer 73 is formed by a dry oxidation process, and may have a thickness of about 30 Å to about 100 Å. Meanwhile, the third insulation layer 74 may be formed during the formation process of the second insulation process 73, and may have a smaller thickness than the thickness of the second insulation layer 73.

The second isolation layer 702 includes a fourth insulation layer 76 formed along the surface of the second trench 75, a fifth insulation layer 77 formed on the fourth insulation layer 76, and a sixth insulation layer 78, formed on the fifth insulation layer 77, to fill the second trench 75. Furthermore, the second isolation layer 702 may further include a seventh insulation layer 79 formed between the substrate 70 and the fourth insulation layer 76. Although described below in detail, the seventh insulation layer 77 may be formed during the formation process of the fifth insulation layer 77. Whether the seventh insulation layer 79 is to be formed or not may be decided by the formation method of the fifth insulation layer 77.

The fourth, fifth, and seventh insulation layers 76, 77, and 79 may be formed of oxide. For example, the oxide may include silicon oxide. The sixth insulation layer 78 may be formed of a nitride. For example, the nitride may include silicon nitride.

The fourth and sixth insulation layers 76 and 78 may be formed by a deposition process, and the fifth and seventh insulation layers 77 and 79 may be formed by an oxidation process. For example, the deposition process may include CVD, and the oxidation process may include a dry oxidation process.

The fourth insulation layer 76 may have a larger thickness than the thickness of the fifth insulation layer 77, and the sixth insulation layer 78 may have a larger thickness than the thickness of the fourth insulation layer 76.

The fourth insulation layer 76 may include silicon nitride formed by CVD, and may have a thickness of about 60 Å to about 220 Å. The fifth insulation layer 77 may include oxide formed by a dry oxidation process, and may have a thickness of about 30 Å to about 100 Å. The sixth insulation layer 78 may include nitride formed by CVD, and may have a thickness of about 200 Å to about 500 Å. Meanwhile, the seventh insulation layer 79 may be formed during the formation process of the fifth insulation layer 77, and may have a smaller thickness than the thickness of the fifth insulation layer 77.

The first to third insulation layers 72 to 74, which are formed in the first trench 71, may have the same materials, thicknesses, and stacked structure as the fourth to seventh insulation layers 76 to 79, which are formed in the second trench 75.

The buried gate structure 80, which is formed in the substrate 70, may include a trench 80a formed in the substrate 70, a gate dielectric layer (not illustrated) formed on the surface of the trench 80a, a buried gate electrode 80b filling a part of the trench 80a over the gate dielectric layer 80a, and a capping layer 80c filling the rest of the trench 80a over the buried gate electrode 80b. The trench 80a may include a line pattern that crosses the first isolation layer 701, the second isolation layer 702, and the active region.

The trenches are formed in the first and second isolation layers 701 and 702 may have the same depth as a depth of a trench 80a formed in the active region, or may have a larger depth than the depth of the trench 80a formed in the active region. In the latter case, since the active region under the trench 80a has a pin structure, a gate control force may be increased.

In the semiconductor device having the above-described structure, the first isolation layer 701, which is formed in the first trench 71, includes the first and second insulation layers 72 and 73. The first and second insulation layers 73 are formed of the same material, thereby preventing a seam from occurring in the first isolation layer. Accordingly, it is possible to prevent a bridge from being formed when the buried gate structure 80 is formed in the substrate 70.

Furthermore, the first and second insulation layers 72 and 73 make it possible to minimize damage to the substrate surface during the trench formation process for isolation.

Furthermore, since the first isolation layer 701 includes the first and second insulation layers 72 and 73 and the second isolation layer 702 includes the fourth to seventh insulation layers 76 to 79, the active region defined by the first and second isolation layers 701 and 702 may be prevented from being bent.

Furthermore, it is possible to prevent the area of the active region from being reduced during the isolation layer formation process.

FIGS. 8A to 8D are diagram illustrating a method for fabricating an exemplary semiconductor device having a buried gate. FIGS. 8A to 8D are cross-sectional views taken along line A-A' of FIG. 6.

Figure 8A:
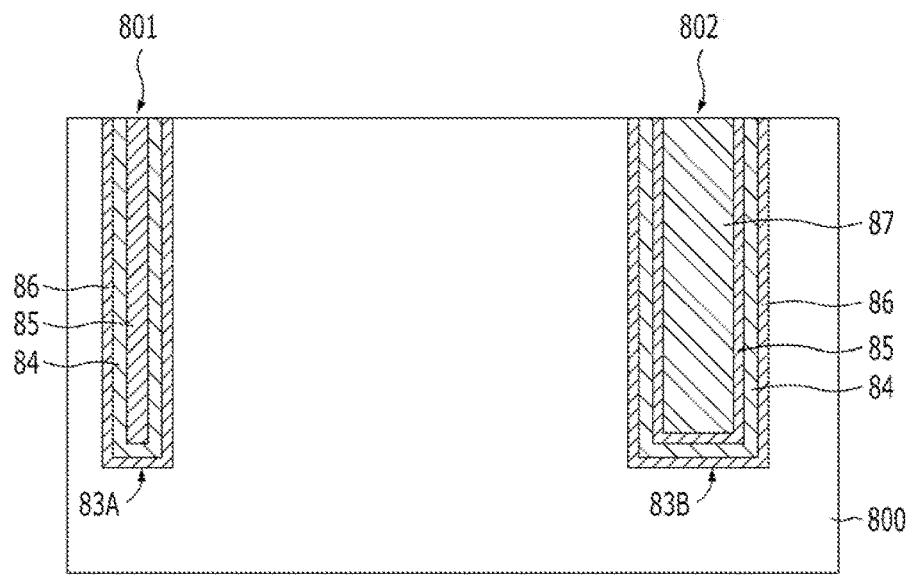
FIGS. 8A to 8D are diagrams illustrating a method for fabricating the semiconductor device having a buried gate in accordance with the third implementation of the present invention.

Referring to FIG. 8A, a plurality of isolation layers are formed in a substrate 800. The substrate 800 may have a single crystal state, and may include a silicon containing material. For example, the substrate 800 may include a silicon substrate or SOI substrate.

The process for forming the plurality of isolation layers is performed as follows. First, a plurality of trenches are formed in the substrate 800. The plurality of trenches may include a first trench 83A having a first CD W1 and a second trench 83B having a second CD W2. The first CD W1 may be smaller than the second CD W2 (W1<W2).

Then, a first insulation layer 84 is formed on a surfaces defining of the first and second trenches 83A and 83B. The first insulation layer 84 may be formed of an oxide, and the oxide may include silicon oxide. The first insulation layer 84 may include an oxide formed by CVD.

Subsequently, a second insulation layer 85 is formed along a surface of the structure including the first insulation layer 84. At this time, the second insulation layer 85 is formed to fill the first trench 83A. The second insulation layer 85 may be formed of an oxide. For example, the oxide may include silicon oxide. The second insulation layer 85 may be formed by oxidizing the first insulation layer 84 under an oxygen atmosphere through an oxidation process. The oxidation process may include a dry oxidation process, a wet oxidation process, a plasma oxidation process, and a radical oxidation process. For example, the second insulation layer 35 may be formed by a dry oxidation process.

When the second insulation layer 85 is formed, the substrate 800 may be oxidized by a dry oxidation process so as to form a third insulation layer 86 between the substrate 800 and the first insulation layer 84. The third insulation layer 86 may be formed of oxide. For example, the oxide may include silicon oxide.

Then, a fourth insulation layer 87 is formed along the surface of the structure including the second insulation layer

85. The third insulation layer 87 may be formed of nitride. For example, the nitride may include silicon nitride. The third nitride layer 87 may include oxide formed by CVD.

Subsequently, a planarization process is performed until the surface of the substrate 800 is exposed. The planarization process may include CMP.

Accordingly, the first isolation layer 801, which includes the first trench 83A, the first insulation layer 84, the second insulation layer 85, and the third insulation layer 86, and the second isolation layer 802, which includes the second trench 83B, the first insulation layer 84, the second insulation layer 85, the fourth insulation layer 87, and the third insulation layer 86, may be formed.

Figure 8B:
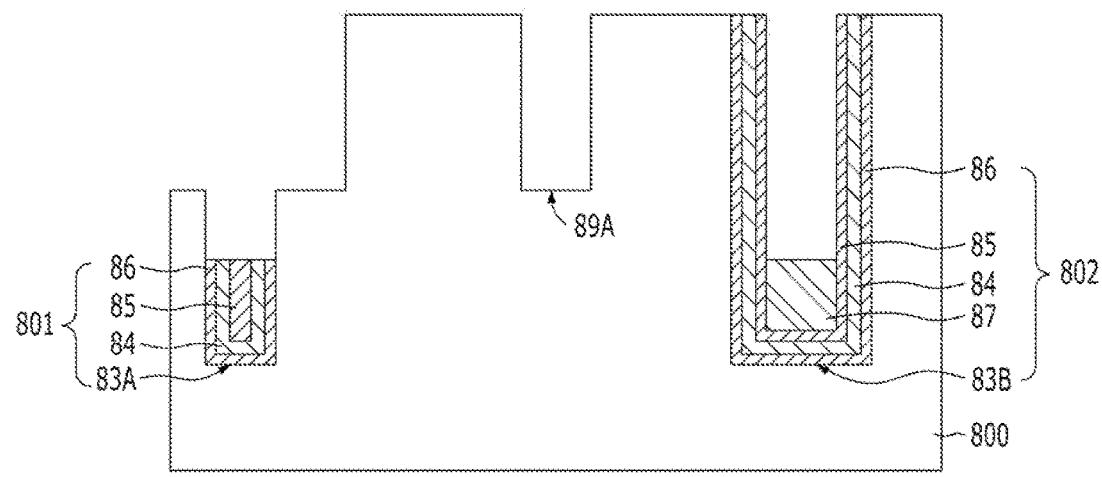

Referring to FIG. 8B, a plurality of trenches 89A for forming buried gates are formed in the substrate 800 having the first and second isolation layers 801 and 802 formed therein. An etch process for forming the trench 89A may include anisotropic etching. The plurality of trenches 89A may be formed in a line type, and may have a smaller depth than a depth of the first and second trenches 83A and 83B for isolation.

Figure 8C:
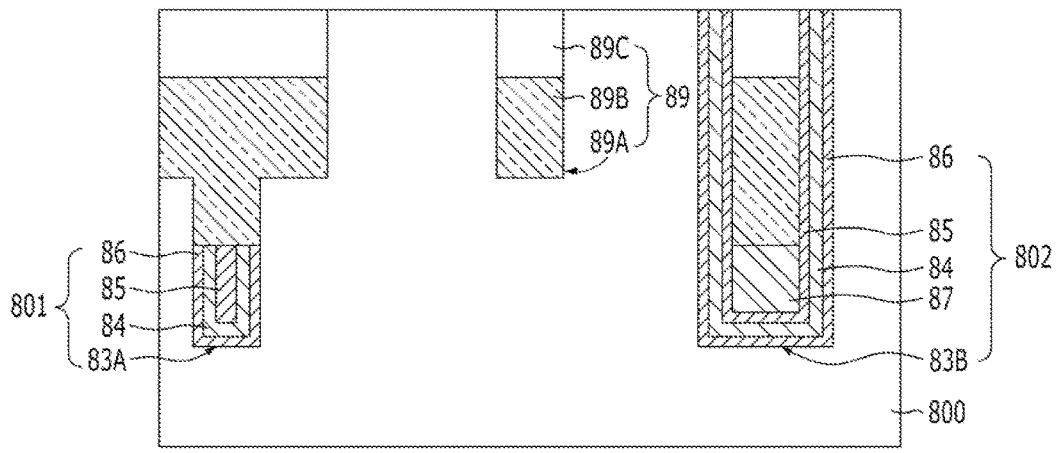

Referring to FIG. 8C, a gate dielectric layer (not illustrated) is formed on the surface of the trench 89A. The gate dielectric layer may be formed of an oxide, and the oxide may be formed by thermal oxidation or radical oxidation.

Then, a gate conductive layer is formed on the entire surface of the substrate 800 so as to fill the trench 89A. Planarization and etch-back processes are sequentially performed to form a buried gate electrode 89B that partially fills the trench 89A. The planarization process may include CMP.

Subsequently, an insulator is deposited on the entire surface of the substrate 800 to gap-fill the trench 89A, and a planarization process is performed to form a capping layer 89C that fills the trench 89A over the buried gate electrode 89B. Meanwhile, the capping layer 89C may be formed to cover the entire surface of the substrate 800 while gap-filling the rest of the trench 89A.

89, which includes the plurality of trenches 89A, the gate dielectric layer (not illustrated), the buried gate electrode 89B, and the capping layer 89C, may be formed.

Figure 8D:
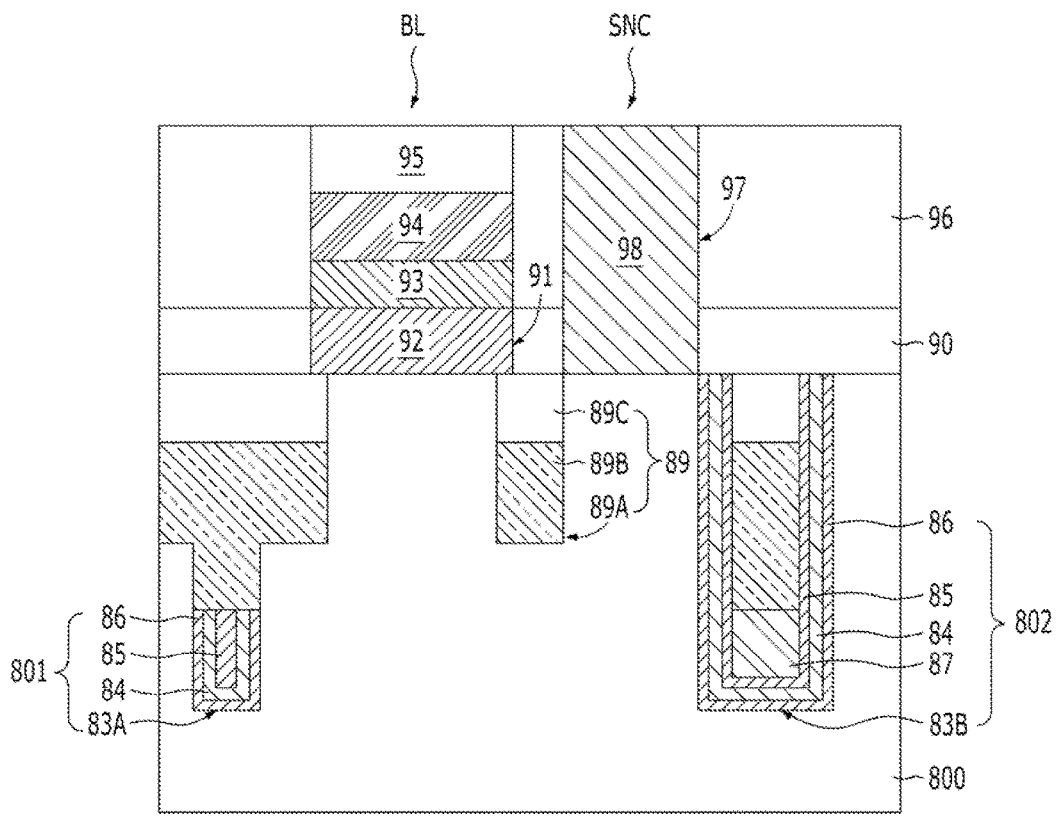

Referring to FIG. 8D, a first interlayer dielectric layer 90 is formed on the entire surface of the substrate 80. The first interlayer dielectric layer 90 may include an oxide, a nitride, or anoxynitride, or a combination thereof.

The first interlayer dielectric layer 90 is selectively etched to form a bit line contact hole 91 that exposes the substrate 80 between the buried gate structures 89. A first conductive layer 92 is formed on the entire surface of the substrate 80 to fill the bit line contact hole 91. The first conductive layer 92 may include a silicon containing layer. For example, the first conductive layer 92 may include polysilicon.

A barrier layer 93 is formed over the first conductive layer 92. The barrier layer 93 may include a stacked layer in which different material layers are stacked.

Furthermore, a second conductive layer 94 is formed over the barrier layer 93. The second conductive layer 94 may be formed of a material having lower resistance than a resistance of the first conductive layer, in order to reduce the entire resistance of a subsequently formed bit line. Therefore, the second conductive layer 94 may be formed of a metallic layer. The metallic layer may include metal, metal oxide, or metal nitride. For example, the second conductive layer 94 may include tungsten.

Then, a hard mask layer pattern 95 is formed over the second conductive layer 94. The hard mask layer pattern 95 may include an insulator. For example, the hard mask layer pattern 95 may include an oxide, a nitride, an oxynitride, a carbon containing layer, or a combination thereof. For example, the hard mask layer pattern 95 may be formed of nitride, for example, silicon nitride.

Through the above-described series of processes, a bit line structure BL, which includes the first conductive layer 92, the barrier layer 93, the second conductive layer 94, and the hard mask layer pattern 95, is formed.

Then, a second interlayer dielectric layer 96 is formed to cover the entire surface of the substrate 800, including the bit line structure BL. The second interlayer dielectric layer 96 may include an oxide, a nitride, anoxynitride, or a combination thereof.

Subsequently, the second interlayer dielectric layer 96 is selectively etched to form a storage node contact hole 97 that exposes the substrate 800 between the buried gate structure 89 and the second isolation layer 804. The storage node contact hole 97 is filled with a conductive material to form a storage node contact plug 98.

The storage node contact plug 98 may include a semiconductor layer or a metallic layer. The semiconductor layer may include a silicon containing material, and the silicon containing material may include silicon. The metallic layer may include a metal, a metal oxide, a metal nitride, a metal silicide, other like. The metallic layer is a conductive layer.

During a related isolation layer formation process, a seam may be formed in an isolation layer that fills an isolation trench. Accordingly, when a buried gate is formed in a substrate including the isolation layer, a gate conductive layer to partially fill the trench may be implanted into the seam and form a bridge between the buried gates. In contrast, as discussed above, an exemplary implementation discloses that the first insulation layer 84 is formed on the surface defining the first trench 83A, and the second insulation layer 85a is formed over the first insulation layer 84 through an oxidation process, thereby fundamentally blocking the occurrence of the seam. Accordingly, it is possible to prevent a bridge between the buried gates, which may be formed by a seam.

Figure 9:
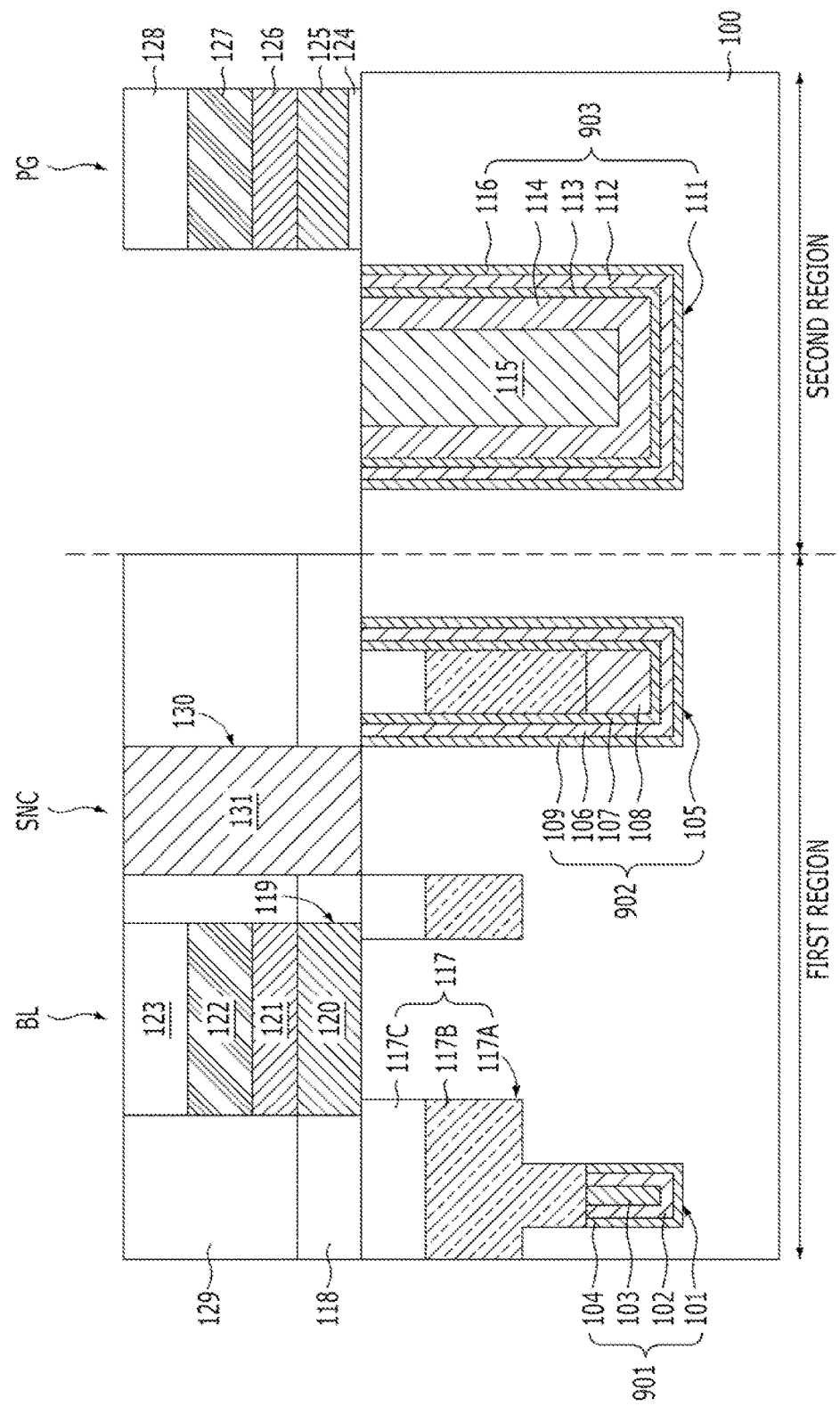
FIG. 9 is a diagram illustrating the semiconductor device having a buried gate in accordance with the fourth implementation of the present invention.

FIG. 9 is a diagram illustrating an exemplary semiconductor device having a buried gate. FIG. 9 includes first and second regions. The first region corresponds to a cross-sectional view taken along line A-A of FIG. 6, and the second region corresponds to a cross-sectional view taken along line B-B of FIG. 6.

Referring to FIGS. 6 and 9, the semiconductor device in accordance with the implementation of the present invention may include the first and second regions. The first region may include a first isolation layer 901 formed in a first trench 101 having a first CD W1 and a second isolation layer 902 formed in a second trench 105 having a second CD W2. The second region may include a third isolation layer 903 formed in a third trench 111 having a third CD W3.

Furthermore, the semiconductor device may include a plurality of buried gate structures 117 crossing the substrate 100 of the first region including an active region defined by the first and second isolation layers 901 and 902.

The first region may include a bit line structure BL and a storage node contact plug 131 that are formed over the substrate 100, and the second region may include a peri-gate PG formed over the substrate 100.

Here, if an exemplary semiconductor device is a semiconductor memory device such as DRAM, then the first region may correspond to a cell region, and the second region may correspond to a peripheral circuit region. The first CD W1 may be smaller than the second CD W2, and the second CD W2 may be smaller than the third CD W3 (W1<W2<W3).

The first isolation layer 901 may include a first insulation layer 102 formed along the surface of the first trench 101 and a second insulation layer 103, formed on the first insulation layer 102, to fill the first trench 101. The first isolation layer 901 may further include a third insulation layer 104 formed between the substrate 100 and the first insulation layer 102. The third insulation layer 104 may be formed during the formation process of the second insulation layer 103. Whether the third insulation layer 104 is to be formed or not may be decided by the formation process of the second insulation layer 103.

The first to third insulation layers 102 to 104 may include an oxide. For example, the oxide may include silicon oxide.

The first insulation layer 102 may include an oxide formed by a deposition process, and the second and third insulation layers 103 and 104 may include an oxide formed by an oxidation process. For example, the deposition process may include CVD, and the oxidation process may include a dry oxidation process.

The first insulation layer 102 may have a larger thickness than a thickness of the second insulation layer 103.

The first insulation layer 102 may include silicon nitride formed by CVD, and may have a thickness of about 60 Å to about 220 Å. The second insulation layer 103 may be formed by a dry oxidation process, and may have a thickness of about 30 Å to about 100 Å.

Meanwhile, the third insulation layer 104 may be formed during the formation process of the second insulation layer 103, and may have a smaller thickness than a thickness of the second insulation layer 103.

The second isolation layer 902 may include a fourth insulation layer 106 formed along a surface defining the second trench 105, a fifth insulation layer 107 formed on the fourth insulation layer 106, and a sixth insulation layer 108, formed on the fifth insulation layer 107, to fill the rest of the second trench 105. The second isolation layer 902 may further include a seventh insulation layer 109 formed between the substrate 100 and the fourth insulation layer 106. The seventh insulation layer 109 may be formed during the formation process of the fifth insulation layer 107. Whether the seventh insulation layer 109 is to be formed or not may be decided by the formation method of the fifth insulation layer 107.

The fourth, fifth, and seventh insulation layers 106, 107, and 109 may be formed of an oxide. For example, the oxide may include silicon oxide. The sixth insulation layer 108 may be formed of a nitride. For example, the nitride may include silicon nitride.

The fourth and sixth insulation layers 106 and 108 may be formed by a deposition process, and the fifth and seventh insulation layers 107 and 109 may be formed by an oxidation process. For example, the deposition process may include CVD, and the oxidation process may include a dry oxidation process.

The fourth insulation layer 106 may have a larger thickness than a thickness of the fifth insulation layer 107. The sixth insulation layer 108 may have a larger thickness than a thickness of the fourth insulation layer 106.

The fourth insulation layer 106 may include silicon nitride formed by CVD, and may have a thickness of about 60 Å to about 220 Å. The fifth insulation layer 107 may include oxide formed by a dry oxidation process, and may have a thickness of about 30 Å to about 100 Å. The sixth insulation layer 108 may include a nitride formed by CVD, and may have a thickness of about 200 Å to about 500 Å. Meanwhile, the seventh insulation layer 109 may be formed during the formation process of the fifth insulation layer 107, and may have a smaller thickness than the thickness of the fifth insulation layer 107.

The first to third insulation layers 102 to 104 formed in the first trench 101 may have the same materials, thicknesses, and stacked structure as the fourth, fifth, and seventh insulation layers 106, 107, and 109 formed in the second trench 105.

The third isolation layer 903 includes an eighth insulation layer 112 formed along a surface defining the third trench 111, a ninth insulation layer 113 formed on the eighth insulation layer 112, a tenth insulation layer 114 formed on the ninth insulation layer 113, and an eleventh insulation layer 115, formed on the tenth insulation layer 114 to fill the rest of the third trench 111. The third isolation layer 903 may further include a twelfth insulation layer 116 formed between the substrate 100 and the eighth insulation layer 112. As described below in detail, the twelfth insulation layer 116 may be formed during the formation process of the ninth insulation layer 113. Whether the twelfth insulation layer 116 is to be formed or not may be decided by the formation method of the ninth insulation layer 113.

The eighth to twelfth insulation layers 112 to 116 may include an oxide, a nitride, an oxynitride, or a combination thereof. For example, the eighth, ninth, eleventh, and twelfth insulation layers 112, 113, 115, and 116 may include oxide, and the tenth insulation layer 114 may include nitride.

The eighth and tenth insulation layers 112 and 114 may be formed by a deposition process, the ninth and twelfth insulation layers 113 and 116 may be formed by an oxidation process, and the eleventh insulation 115 may be formed by a spin process. For example, the deposition process may include CVD, and the oxidation process may include a dry oxidation process.

The eighth insulation layer 112 may have a larger thickness than a thickness of the ninth insulation layer 113, the tenth insulation layer 114 may have a larger thickness than a thickness of the eighth insulation layer 112, and the eleventh insulation layer 115 may have a larger thickness than a thickness of the tenth insulation layer 114.

The eighth insulation layer 112 may include silicon nitride formed by CVD, and may have a thickness of about 60 Å to about 220 Å. The ninth insulation layer 113 may include an oxide formed by a dry oxidation process, and may have a thickness of about 30 Å to about 100 Å. The tenth insulation layer 114 may include a nitride formed by CVD, and may have a thickness of about 200 Å to about 500 Å. Furthermore, the eleventh insulation layer 115 may include SOD formed by a spin coating method. Meanwhile, the twelfth insulation layer 116 may be formed during the formation process of the ninth insulation layer 113, and may have a smaller thickness than the thickness of the ninth insulation layer 113.

The eighth, ninth, and twelfth insulation layers 112, 113, and 116 formed in the third trench 111 may have the same materials, thicknesses, and stacked structure as the first, second, and third insulation layers 102, 103, and 104, which are formed in the first trench 101, and as the fourth, fifth, and seventh insulation layers 106, 107, and 109, which are formed in the second trench 105.

The buried gate structure 117 formed in the substrate 100 of the first region may include a trench 117a formed in the substrate 100, a gate dielectric layer (not illustrated) formed on the surface of the trench 117a, a buried gate electrode 117b, formed on the gate dielectric layer, to partially fill the trench 117a, and a capping layer 117c, formed over the buried gate electrode 117b, to fill the rest of the trench 117a.

The trench 117a may have a line pattern that crosses the first and second isolation layers 901 and 902 and the active region. The trench 117a, which is formed in the first and second isolation layers 901 and 902, may have a same depth as a depth of the trench 117a formed in the active region, or may have a larger depth than the depth of the trench 117a formed in the active region. In the latter case, since the active region under the trench 117a has a pin structure, a gate control force may be increased.

A first interlayer dielectric layer 118 and a bit line contact plug 120 are formed in the first region having the buried gate structure 117. The bit line contact plug 120 contacts the substrate 100 between the buried gate structures 117 through the first interlayer dielectric layer 118. The bit line contact plug 120 may include a conductive material buried in a bit line contact hole 119 formed in the first interlayer dielectric layer 118 or an insulator, for example, a bit line spacer (not illustrated) formed between the sidewalls of the bit line contact hole 119 and the bit line contact plug 120.

The first interlayer dielectric layer 118 may include any an oxide, a nitride, an oxynitride, or a combination thereof. The bit line contact plug 120 may include a silicon containing layer. The silicon containing layer may include an impurity for improving conductivity. For example, the silicon containing layer may include polysilicon.

A bit line structure BL is formed over the first interlayer dielectric layer 118 and the bit line contact plug 120. The bit line structure BL may include a first barrier layer 121 formed over the bit line contact plug 120, a bit line 122 formed over the first barrier layer 121, and a first hard mask layer 123 formed over the bit line 122. Here, the bit line 122 may include a metallic layer that is a low-resistance material, and the first hard mask layer 123 may include an insulator. For example, the bit line 122 may include tungsten, and the first hard mask layer 123 may include nitride.

Over the substrate 100 of the second region, a peri-gate PG is formed. The peri-gate PG may have a stacked structure in which a gate dielectric layer 124, a first buried gate electrode 125, a second barrier 126, a second buried gate electrode 127, and a second hard mask layer 128 are sequentially stacked.

The first buried gate electrode 125, the second barrier layer 126, the second buried gate electrode 127, and the second hard mask layer 128 may include the same materials as the bit line contact plug 120, the first barrier 110, the bit line electrode 111, and the first hard mask layer 112 of the cell region, respectively. This is because they are formed at the same time by a gate bit line (GBL) process. Therefore, the first buried gate electrode 125 may include a silicon containing layer, and the silicon containing layer may include a silicon containing layer doped with an impurity. Specifically, the conductive type of impurity implanted into the first buried gate electrode 125 is decided according to the conductive type of the peri-gate PG. For example, if the peri-gate PG has a P-type channel, then the first buried gate electrode 125 may include a silicon containing layer doped with a P-type impurity.

The second buried gate electrode 127 may include a metallic layer, for example, tungsten. Furthermore, the second hard mask layer 128 may include an insulator, for example, low-pressure nitride formed in a furnace.

A second interlayer dielectric layer 129 and a storage node contact plug 131 are formed over the substrate 100 of the second region. The storage node contact plug 131 is contacted with the substrate 100 between the buried gate structure 117 and the second isolation layer 902 through the second interlayer dielectric layer 129. At this time, the storage node contact plug 131 may include a conductive material buried in the storage node contact hole 130.

The second interlayer dielectric layer 129 may include an oxide, a nitride, an oxynitride, or a combination thereof. The storage node contact plug 131 may include a semiconductor layer and a metallic layer. The semiconductor layer may include a silicon containing material, and the silicon containing material may include silicon. The metallic layer may include a metal, a metal oxide, a metal nitride, a metal silicide, other like. The metallic layer indicates a conductive layer including metal.

In the semiconductor device having the above-described structure, the first isolation layer 901, is buried in the first trench 101, and includes the first and second insulation layers 102 and 103, which are formed of the same material, thereby preventing a seam from occurring in the first isolation layer 901. Accordingly, it is possible to prevent a bridge from being formed when the buried gate structure 117 is formed in the substrate 100. Furthermore, the first and second insulation layers 102 and 103 more effectively minimize damage that may occur to the substrate the trench formation process.

Furthermore, the first isolation layer 901 includes the first and second insulation layers 102 and 103, and the second isolation layer 902 includes the fourth to seventh insulation layers 106 to 109. Therefore, the active region defined by the first and second isolation layers 901 and 902 may be prevented from being bent.

Furthermore, it is possible to prevent the area of the active region from being reduced during the isolation layer formation process.

Figure 10:
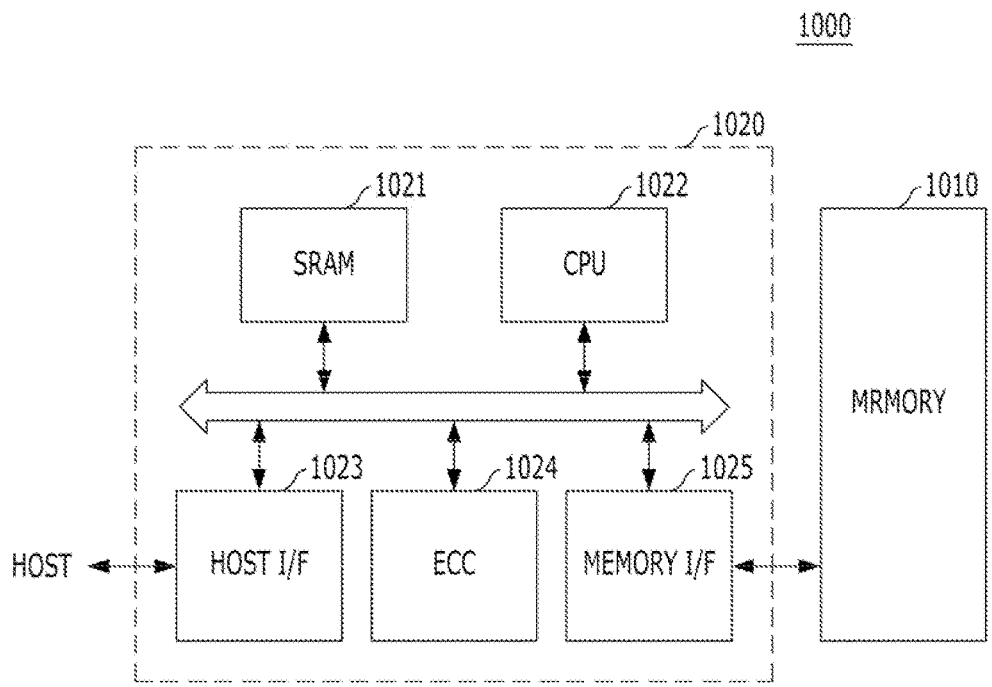
FIG. 10 is a block diagram illustrating an exemplary memory card including an exemplary semiconductor device, as described herein.

FIG. 10 is a block diagram illustrating an exemplary memory card including the semiconductor device in accordance with the implementation of the present invention.

Referring to FIG. 10, the semiconductor device in accordance with the implementation of the present invention may be applied to a memory card 1000. For example, the memory card 1000 may include a memory controller 1020 configured to control data exchange between a host and a semiconductor memory 1010. The memory controller 1020 may include an SRAM 1021, a central processing unit (CPU) 1022, a host interface 1023, an error correction code (ECC) 1024, and a memory interface 1025. The SRAM 1021 may be used as a memory of the CPU 1022. The host interface 1023 may include a data exchange protocol of the host connected to the memory card 1000. The ECC 1024 is configured to detect and correct an error included in data read from the semiconductor memory 1010. The memory interface 1025 is configured to interface the semiconductor memory 1010. The CPU 1022 is configured to perform overall control operations for data exchange of the memory controller 1020. As the semiconductor memory 1010 applied to the memory card 1000 includes an exemplary semiconductor device, a bridge between the bit lines may be prevented from being formed. Furthermore, the active region may be prevented from being bent. Furthermore, as the plurality of oxide layers are formed on both sidewalls of the isolation trench of the peripheral circuit region, the thickness may be increased to improve HEIP.

Figure 11:
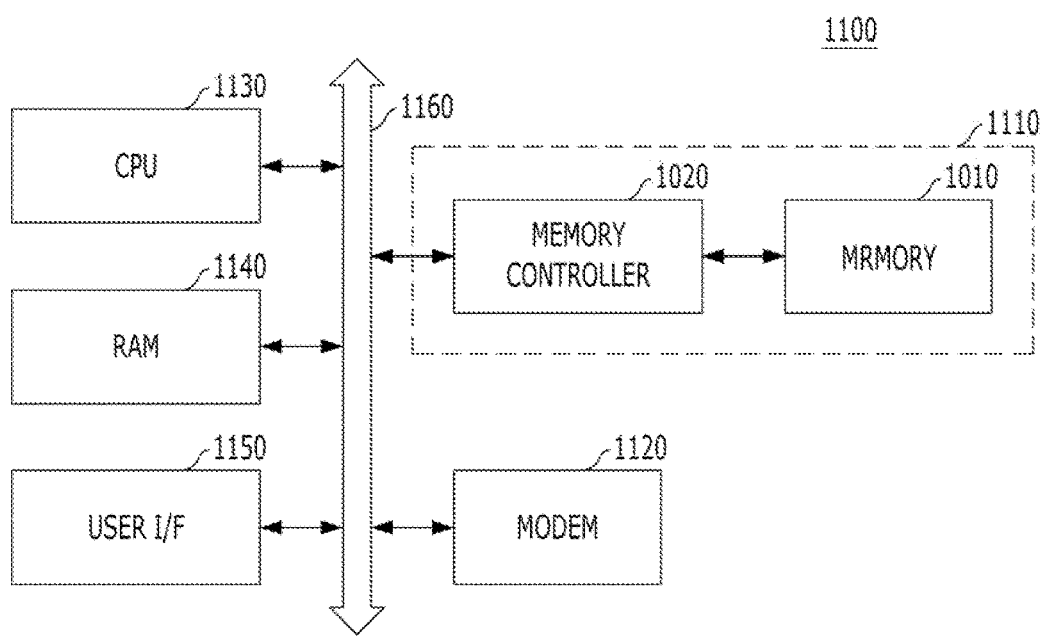
FIG. 11 is a block diagram illustrating an example of an exemplary electronic system including an exemplary semiconductor device, as described herein.

FIG. 11 is a block diagram illustrating an example of an exemplary electronic system including an exemplary semiconductor device, as described above.

Referring to FIG. 11, an exemplary electronic system 1100 may include a memory system 1110, a modem 1120, a CPU 1130, a RAM 1140, and a user interface 1150. The modem 1120, the CPU 1130, the RAM 1140, and the user interface 1150 are electrically connected to a system bus 1160. The memory system 1110 may store data processed by the CPU 1130 or data inputted from outside. The memory system 1110 may include a memory 1010 and a memory controller 1020, and may be configured in the same manner as the memory card 100 described with reference to FIG. 7.

An exemplary electronic system 100 may be provided as a personal digital assistant (PDA), a portable computer, a web tablet, a wireless phone, a mobile phone, a digital music player, a memory card, all electronic products capable of transmitting and/or receiving information in a wireless environment, a solid state disk, a camera image sensor, or other application chipsets.

An exemplary semiconductor device or exemplary memory system may be mounted into various types of packages. For example, the semiconductor device or memory system may be packaged and mounted according to various methods including PoP (package on package), ball grid arrays (BGAs), chip scale package (CPSs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP), or wafer-level chip scale package (WLCSP).

Although various implementations have been described for illustrative purposes, it will be apparent to those skilled in the art that various changes and modifications may be made without departing from the spirit and scope of the invention as defined in the following claims.

What is claimed is:

1. A method for fabricating an isolation layer, comprising:
   forming a trench in a substrate;
   forming a first oxide layer in the trench; and
   forming a second oxide layer by oxidizing the first oxide layer; and
   forming a third oxide layer by oxidizing the substrate adjacent to the trench when the second oxide layer is formed.

2. The method of claim 1, further comprising forming a nitride layer to gap-fill the trench over the second oxide layer.

3. The method of claim 1, wherein a region includes first and second trenches, wherein the first trench has a first critical dimension (CD) and the second trench has a second critical dimension (CD), and
   wherein the second CD is larger than the first CD.

4. The method of claim 3, wherein the second oxide layer gap-fills the first CD and lines the second CD.

5. The method of claim 4, further comprising gap-filling the second CD over the second oxide layer with a nitride layer.

6. The method of claim 2, wherein the first oxide layer and the nitride layer are formed by chemical vapor deposition (CVD), and the second and third oxide layers are formed by a dry oxidation process.

7. The method of claim 1, wherein the isolation layer isolates a plurality of active regions formed in a cell region of a memory device.

8. A method for fabricating an isolation layer, comprising:
   forming a first trench having a first critical dimension (CD) and a third trench having a third critical dimension (CD) in a first region of a substrate;
   forming a second trench having a second critical dimension in a second region of the substrate;
   forming a first oxide layer in the first, the second, and the third trenches;
   oxidizing the first oxide layer to form a second oxide layer, the second oxide layer gap-filling the first trench and lining the third trench and the second trench;
   forming a nitride layer over the second oxide layer to gap fill the third trench and line the second trench;
   forming a third oxide layer over the nitride layer to gap-fill the second trench; and
   oxidizing the substrate located under the first oxide layer to form a fourth oxide layer under the first oxide layer and in a liner shape,
   wherein the second oxide layer and the fourth oxide layer are formed substantially at the same time.

9. The method of claim 8, wherein the first oxide layer and the nitride layer are formed by CVD, the second and fourth oxide layers are formed by a dry oxidation process, and the third oxide layer is formed by a spin coating method.

10. The method of claim 8, wherein the isolation layer isolates a plurality of active regions formed in a cell region of a memory device.

* * * * *